United States Patent
Hatano et al.

(10) Patent No.: US 8,592,261 B2
(45) Date of Patent: Nov. 26, 2013

(54) METHOD FOR DESIGNING SEMICONDUCTOR DEVICE

(75) Inventors: Kaoru Hatano, Kanagawa (JP); Satoshi Seo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 267 days.

(21) Appl. No.: 13/217,723

(22) Filed: Aug. 25, 2011

(65) Prior Publication Data

US 2012/0052602 A1 Mar. 1, 2012

(30) Foreign Application Priority Data

Aug. 27, 2010 (JP) ................. 2010-191420

(51) Int. Cl.
*H01L 21/00* (2006.01)
*H01L 21/31* (2006.01)
*H01L 21/66* (2006.01)
*H01L 21/84* (2006.01)
*H01L 21/469* (2006.01)

(52) U.S. Cl.
USPC ............ 438/149; 438/14; 438/161; 438/778; 438/781; 257/E21.529; 257/E21.53

(58) Field of Classification Search
USPC ............................ 438/14, 149, 161, 781, 778; 257/E21.529, E21.53
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |

(Continued)

FOREIGN PATENT DOCUMENTS

| EP | 1 737 044 A1 | 12/2006 |
|---|---|---|
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Mohsen Ahmadi
(74) *Attorney, Agent, or Firm* — Fish & Richardson P.C.

(57) ABSTRACT

A semiconductor device may be designed in the following manner. A stacked layer of a silicon oxide film and an organic film is provided over a substrate, deuterated water is contained in the organic film, and then a conductive film is formed in contact with the organic film. Next, an inert conductive material that does not easily generate a deuterium ion or a deuterium molecule is selected by measuring the amount of deuterium that exists in the silicon oxide film.

18 Claims, 11 Drawing Sheets

(56) References Cited

U.S. PATENT DOCUMENTS

| | | | |
|---|---|---|---|
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,183,099 B2 | 5/2012 | Sakata | |
| 8,481,377 B2* | 7/2013 | Akimoto et al. | 438/181 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2009/0008639 A1 | 1/2009 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0133181 A1* | 6/2011 | Yamazaki | 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

(56) References Cited

OTHER PUBLICATIONS

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission Amoled Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

(56) References Cited

OTHER PUBLICATIONS

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (M<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner deuterated water
601
517
506
516
518
515b 502
601
deuterium ion or deuterium molecule
531 detecting deuterium atoms 1602
1603 } 1600
1601
1510

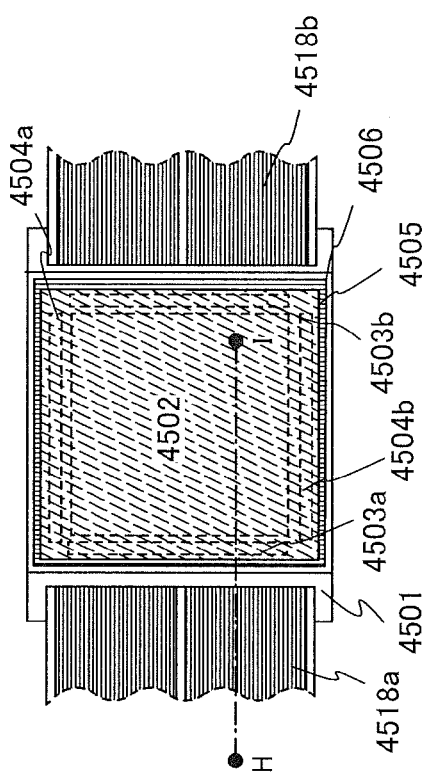
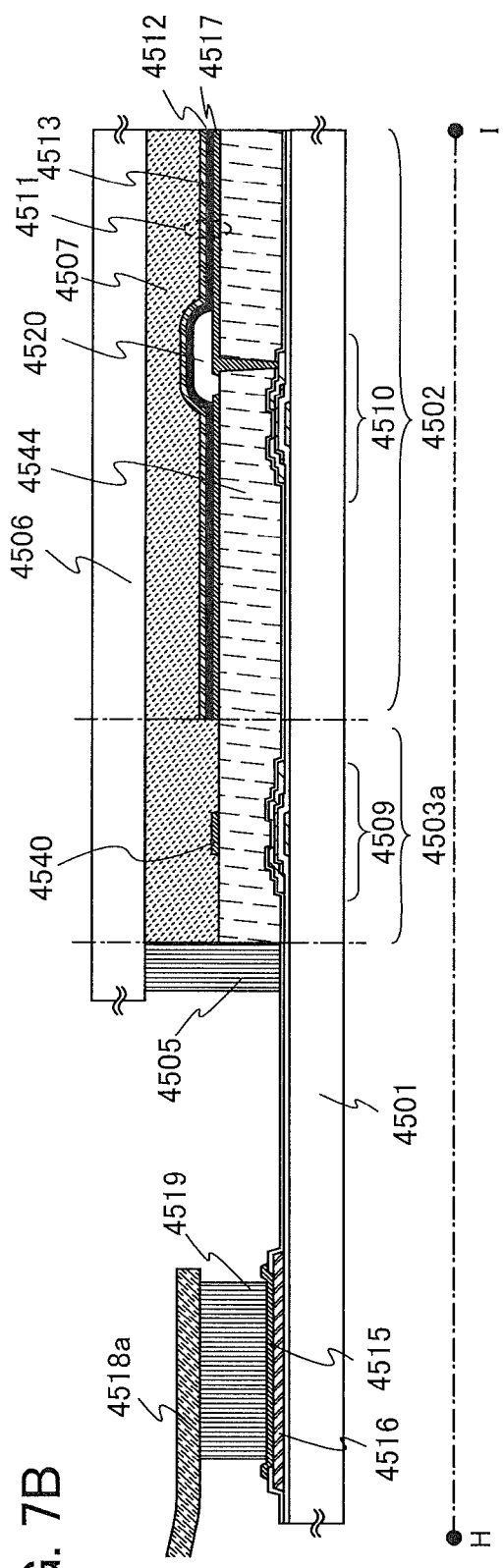
FIG. 7A
FIG. 7B

METHOD FOR DESIGNING SEMICONDUCTOR DEVICE

BACKGROUND OF THE INVENTION

1. Field of the Invention

The present invention relates to a method for designing a semiconductor device including an oxide semiconductor.

The semiconductor device in this specification refers to all devices including a semiconductor element that can function by utilizing semiconductor characteristics; semiconductor circuits, electro-optic devices, display devices, and electronic devices are all semiconductor devices.

2. Description of the Related Art

A technique in which a transistor is formed using a semiconductor material such as amorphous silicon, polysilicon, or transferred single crystal silicon over a substrate having an insulating surface has been known. While a transistor including amorphous silicon has low field effect mobility, the transistor can be easily formed over a large-area glass substrate. On the other hand, while a transistor including polycrystalline silicon has relatively high field effect mobility, the transistor requires a crystallization step such as laser annealing and cannot necessarily be easily formed over a large-area glass substrate. Further, a transistor including single crystal silicon cannot necessarily be easily formed over a large-area substrate.

On the other hand, transistors including an oxide semiconductor as s semiconductor material have attracted attention. For example, Patent Document 1 and Patent Document 2 disclose a technique in which a transistor is manufactured using zinc oxide or an In—Ga—Zn—O-based oxide semiconductor as a semiconductor material and such a transistor is used as a switching element or the like of an image display device.

A transistor including an oxide semiconductor in a channel formation region (also referred to as a channel region) can have higher field-effect mobility than a transistor including amorphous silicon. An oxide semiconductor film can be easily formed over a large-area glass substrate by a sputtering method or the like and can be formed at a temperature of lower than or equal to 300° C.; therefore, a manufacturing process of the transistor including an oxide semiconductor is simpler than that of a transistor including polycrystalline silicon.

The transistors including an oxide semiconductor can be applied to, for example, transistors included in a switching element provided in a pixel portion or transistors included in a driver circuit portion in a display device. Note that a driver circuit of a display device includes, for example, a shift register circuit, a buffer circuit, or the like, and the shift register circuit and the buffer circuit further include a logic circuit. By applying the transistor including an oxide semiconductor to a logic circuit of a driver circuit, the driver circuit can be driven at higher speed than in the case where a transistor including amorphous silicon is applied.

In addition, the logic circuit can be formed with transistors all having the same conductivity type. By manufacturing a logic circuit using transistors all having the same conductivity type, a process can be simplified.

With the use of a glass substrate or a plastic substrate over which such a transistor including an oxide semiconductor is formed, provision of display devices such as a liquid crystal display, an electroluminescent display (also referred to as an EL display), and electronic paper has been considered.

REFERENCE

[Patent Document 1] Japanese Published Patent Application No. 2007-123861

[Patent Document 2] Japanese Published Patent Application No. 2007-096055

SUMMARY OF THE INVENTION

There is a problem in that a transistor including an oxide semiconductor in a channel formation region, which is of an enhancement (also referred to as normally-off) type, has changed into a depletion (also referred to as normally-on) type due to the use. In a semiconductor device, a first electrode is electrically connected to a source electrode layer or a drain electrode layer of the enhancement transistor including an oxide semiconductor in a channel formation region, and an organic layer containing a light-emitting substance is provided between the first electrode and a second electrode overlapped with the first electrode. Particularly in such a semiconductor device, there is a problem in that the transistor including an oxide semiconductor has changed into a depletion type over time and the reliability of the semiconductor device has degraded.

The present invention is made in view of the foregoing technical background. Therefore, an object of one embodiment of the present invention is to provide a method for designing a highly reliable semiconductor device including an oxide semiconductor. Further, another object of one embodiment of the present invention is to provide a method for designing a highly reliable light-emitting device including an oxide semiconductor. Furthermore, another object of one embodiment of the present invention is to provide a method for evaluating a conductive film used for a semiconductor device including an oxide semiconductor.

In order to achieve the above objects, the present invention focuses on impurities including a hydrogen atom, which are contained in a semiconductor device including an oxide semiconductor, and an active material which releases a hydrogen ion or a hydrogen molecule by reducing the impurities. Specifically, the present invention focuses on a conductive film formed over an oxide semiconductor.

Impurities including a hydrogen atom remain in and/or enter the semiconductor device including an oxide semiconductor from the outside of sealed portion. In particular, it is difficult to completely remove moisture from the semiconductor device and/or completely prevent entry of moisture from the air. Therefore, when an active metal that reduces moisture exists in a semiconductor element or the semiconductor device, a hydrogen ion or a hydrogen molecule is generated as a result of the reaction with moisture which remains in and/or enters the semiconductor element or the semiconductor device from the outside of sealed portion and the generated hydrogen ion or hydrogen molecule is diffused into the semiconductor element or the semiconductor device. The present inventors have considered that carrier concentration of an oxide semiconductor is increased by the hydrogen ion or hydrogen molecule that has reached the oxide semiconductor by diffusion; therefore, the characteristics of a transistor including an oxide semiconductor have varied.

In order to solve the above problems, a semiconductor device including an oxide semiconductor may be designed using impurities including hydrogen, specifically an inert conductive material that reacts with water to a degree that does not easily allows generation of a hydrogen ion or a hydrogen molecule. Specifically, the semiconductor device may be designed in the following manner. A stacked layer of a silicon oxide film and an organic film is provided over a substrate, deuterated water is contained in the organic film, and then a conductive film is formed in contact with the organic film. Next, an inert conductive material that does not easily generate a deuterium ion or a deuterium molecule is selected by measuring the amount of deuterium that exists in the silicon oxide film.

In other words, one embodiment of the present invention is a method for designing a semiconductor device, which includes a first electrode electrically connected to a source electrode layer or a drain electrode layer of an enhancement transistor including an oxide semiconductor in a channel formation region, and an organic layer containing a light-emitting substance provided between the first electrode and a second electrode overlapped with the first electrode, in which a silicon oxide film is formed on one surface of a substrate; an organic film is formed so as to cover the silicon oxide film; the organic film is coated with deuterated water; a conductive film is formed in contact with the organic film; a concentration of deuterium atoms in the silicon oxide film is measured; a conductive material whose concentration of the deuterium atoms is higher than or equal to $1\times10^{15}$ atoms/cm$^3$ and lower than or equal to $1\times10^{17}$ atoms/cm$^3$ is selected; and the selected conductive material is applied to the second electrode.

According to the above embodiment of the present invention, deuterated water containing deuterium atoms at a concentration higher than the concentration of deuterium atoms distributed naturally is used; therefore, activation of the conductive film can be evaluated in terms of reduction of water. Accordingly, a method for designing a highly reliable semiconductor device including an oxide semiconductor, in which an inert conductive material that reacts with water to a degree that does not easily allows generation of a hydrogen ion or a hydrogen molecule can be selected and generation of a hydrogen ion or a hydrogen molecule that increases carrier concentration of an oxide semiconductor is suppressed, can be provided. Further, a method for designing a highly reliable light-emitting device including an oxide semiconductor can be provided. Furthermore, a method for evaluating a conductive film used for a semiconductor device including an oxide semiconductor can be provided.

Another embodiment of the present invention is a method for designing a semiconductor device, which includes a first electrode electrically connected to a source electrode layer or a drain electrode layer of an enhancement transistor including an oxide semiconductor in a channel formation region, and an organic layer containing a light-emitting substance provided between the first electrode and a second electrode overlapped with the first electrode, in which an enhancement transistor for design including an oxide semiconductor for design in a channel formation region is formed over an insulating surface of a substrate; an oxide insulating layer for design is formed so as to cover the transistor for design; a first electrode for design electrically connected to a source electrode layer or a drain electrode layer of the transistor for design is formed; the first electrode for design is coated with deuterated water; a conductive film is formed in contact with the first electrode for design; a concentration of deuterium atoms in the oxide semiconductor for design is measured; a conductive material whose concentration of the deuterium atoms is higher than or equal to $5\times10^{15}$ atoms/cm$^3$ and lower than or equal to $1\times10^{17}$ atoms/cm$^3$ is selected; and the selected conductive material is applied to the second electrode.

According to the above embodiment of the present invention, deuterated water containing deuterium atoms at a concentration higher than the concentration of deuterium atoms distributed naturally is used; therefore, activation of the conductive film can be evaluated in terms of reduction of water. Accordingly, a method for designing a highly reliable semiconductor device including an oxide semiconductor, in which an inert conductive material that reacts with water to a degree that does not easily allows generation of a hydrogen ion or a hydrogen molecule can be selected and generation of a hydrogen ion or a hydrogen molecule that increases carrier concentration of an oxide semiconductor is suppressed, can be provided. Further, a method for designing a highly reliable light-emitting device including an oxide semiconductor can be provided. Furthermore, a method for evaluating a conductive film used for a semiconductor device including an oxide semiconductor can be provided.

Note that in this specification, a transistor which can be regarded as having no drain current flowing therein when a gate voltage applied to a gate electrode is 0 V and a voltage applied between a source and a drain is at least 1 V is defined as a normally off transistor. In addition, a transistor which can be regarded as having a drain current flowing therein when a gate voltage applied to a gate electrode is 0 V and a voltage applied between a source and a drain is at least 1 V is defined as a normally on transistor.

Alternatively, in this specification, an n-channel transistor having a positive threshold voltage is defined as a normally off transistor, and an n-channel transistor having a negative threshold voltage is defined as a normally on transistor. In addition, a p-channel transistor having a negative threshold voltage is defined as a normally off transistor, and a p-channel transistor having a positive threshold voltage is defined as a normally on transistor.

More specifically, in this specification, an n-channel transistor having a positive gate voltage when drain current-gate voltage characteristics are measured and a drain current is $1\times10^{-12}$ A is defined as a normally off transistor. In addition, an n-channel transistor having a negative gate voltage when drain current-gate voltage characteristics are measured and a drain current is $1\times10^{-12}$ A is defined as a normally on transistor.

Note that in this specification, an "EL layer" refers to a layer provided between a pair of electrodes in a light-emitting element. Thus, a light-emitting layer containing a light-emitting substance which is provided between a pair of electrodes is an embodiment of the EL layer.

In this specification, in the case where a substance A is dispersed in a matrix formed using a substance B, the substance B forming the matrix is referred to as a host material, and the substance A dispersed in the matrix is referred to as a guest material. Note that the substance A and the substance B may each be a single substance or a mixture of two or more kinds of substances.

Note that in this specification, a light-emitting device means an image display device, a light-emitting device, or a light source (including a lighting device). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module in which an IC (integrated circuit) is directly mounted by a COG (chip on glass) method on a substrate provided with a light-emitting element.

According to the present invention, a method for designing a highly reliable semiconductor device including an oxide semiconductor can be provided. Further, a method for designing a highly reliable light-emitting device including an oxide semiconductor can be provided. Furthermore, a method for evaluating a conductive film used for a semiconductor device including an oxide semiconductor can be provided.

BRIEF DESCRIPTION OF THE DRAWINGS

FIGS. 7A and 7B are a plan view and a cross-sectional view illustrating a structure of a display device according to an embodiment.

DETAILED DESCRIPTION OF THE INVENTION

Figure 1A:
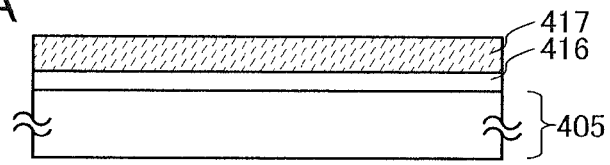
FIGS. 1A to 1E are cross-sectional views illustrating a method for designing a semiconductor device according to an embodiment.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the present invention described below, the same portions or portions having similar functions are denoted by the same reference numerals in different drawings, and description of such portions is not repeated.

Embodiment 1

In this embodiment, a stacked layer of a silicon oxide film and an organic film is provided over a substrate, the organic film is coated with deuterated water, and then a conductive film is formed in contact with the organic film. Next, an inert conductive material that reacts with deuterated water to a degree that does not easily allows generation of a deuterium ion or a deuterium molecule is selected by measuring the amount of deuterium that exists in the silicon oxide film. Further, a method for designing a semiconductor device will be described with reference to FIGS. 1A to 1E. The semiconductor device includes a first electrode electrically connected to a source electrode layer or a drain electrode layer of an enhancement transistor including an oxide semiconductor in a channel formation region, and an organic layer containing a light-emitting substance provided between the first electrode and a second electrode overlapped with the first electrode. A conductive film including the conductive material selected in the above method is applied to the second electrode of the semiconductor device.

A method for designing a semiconductor device, which is exemplified in this embodiment, is illustrated in FIGS. 1A to 1E. A method for designing a semiconductor device according to one embodiment of the present invention includes the following steps: a first step of forming a silicon oxide film 416 on one surface of a substrate 405; a second step of forming an organic film 417 so as to cover the silicon oxide film 416; a third step of coating the organic film 417 with deuterated water; a fourth step of forming a conductive film 402 in contact with the organic film 417; a fifth step of measuring a concentration of deuterium atoms in the silicon oxide film 416; and a sixth step of selecting a conductive material whose concentration of the deuterium atoms is higher than or equal to $1 \times 10^{15}$ atoms/cm$^3$ and lower than or equal to $1 \times 10^{17}$ atoms/cm$^3$. Further, in the method for designing a semiconductor device according to one embodiment of the present invention, the semiconductor device includes a first electrode 1401 electrically connected to a source electrode layer or a drain electrode layer of an enhancement transistor 1410 including an oxide semiconductor in a channel formation region, and an organic layer 1403 containing a light-emitting substance provided between the first electrode 1401 and a second electrode 1402 overlapped with the first electrode 1401. A conductive film including the conductive material selected in the sixth step is applied to the second electrode 1402 of the semiconductor device in a seventh step. Each step will be described below.

<First Step: Formation of Silicon Oxide Film>

The silicon oxide film 416 is formed over the substrate 405. The substrate 405 only needs to have a gas barrier property with respect to water vapor and a hydrogen gas and, in the case where heat treatment is performed in a subsequent step, the substrate 405 needs to have at least heat resistance high enough to withstand the heat temperature. For example, a glass substrate of barium borosilicate glass, aluminoborosilicate glass, or the like, a quartz substrate, a sapphire substrate, a ceramic substrate, or the like can be used. Alternatively, a metal substrate containing stainless steel or a semiconductor substrate having an insulating film formed on its surface may be used. There is a tendency that a flexible substrate formed using a synthetic resin such as plastics generally has a lower upper temperature limit than the above substrates; however, such a substrate can be used as long as it can withstand processing temperature in a manufacturing process. Note that the surface of the substrate 405 may be planarized by polishing such as a CMP method. Further, a semiconductor element or a semiconductor circuit may be formed over the substrate 405 and alternatively a silicon oxide film may be formed over the semiconductor element or semiconductor circuit.

Note that as a method for imparting a gas barrier property to the substrate 405, a barrier layer may be provided between the substrate 405 and the silicon oxide film 416. The barrier layer can prevent a phenomenon in which an impurity element diffuses from the substrate 405 into the silicon oxide film 416. The barrier layer can be formed to have a single-layer structure or a stacked-layer structure using one or more selected from, for example, a silicon nitride film, a silicon oxide film, a silicon nitride oxide film, and a silicon oxynitride film.

In this embodiment, a glass substrate is used as the substrate 405 having an insulating surface.

In this embodiment, a silicon oxide film having a thickness of 200 nm is formed as the silicon oxide film 416 by a sputtering method. The substrate temperature in film formation may be higher than or equal to room temperature and lower than or equal to 300° C. and is 100° C. in this embodiment. The silicon oxide film can be formed by a sputtering method under a rare gas (typically argon) atmosphere, an oxygen atmosphere, or a mixed atmosphere containing a rare gas and oxygen. Further, a silicon oxide target or a silicon target can be used as a target. For example, the silicon oxide film can be formed under an atmosphere containing oxygen by a sputtering method using a silicon target.

<Second Step: Formation of Organic Film>

Next, the organic film 417 is formed over the silicon oxide film 416 (see FIG. 1A). The organic film 417 can be formed using a heat-resistant organic material such as acrylic, polyimide, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. A siloxane-based resin may include, as a substituent, an organic group (e.g., an alkyl group and an aryl group) or a fluoro group. In addition, the organic group may include a fluoro group. Note that the organic film 417 may be formed by stacking a plurality of insulating films formed using any of these materials.

Note that the siloxane-based resin corresponds to a resin including a Si—O—Si bond formed using a siloxane-based material as a starting material.

There is no particular limitation on the formation method of the organic film 417, and the following method can be employed depending on the material: a sputtering method, an SOG method, spin coating, dip coating, a spray method, or a droplet discharging method (e.g., an ink-jet method), a printing method (e.g., screen printing or offset printing), or with a tool (equipment) such as a doctor knife, a roll coater, a curtain coater, or a knife coater.

<Third Step: Coating with Deuterated Water>

Figure 1B:
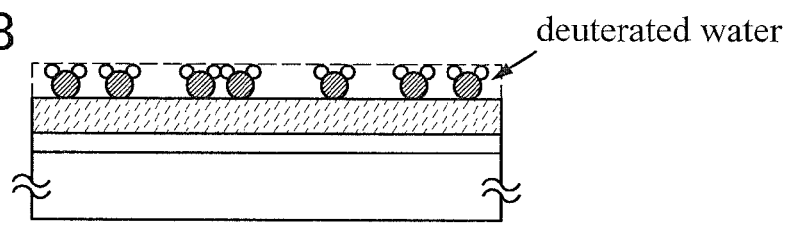

Next, the organic film 417 is coated with deuterated water. After the organic film 417 is held at a temperature lower than room temperature for a certain time (e.g., 10 minutes), the deuterated water is removed. As a method for removing the deuterated water, for example, dry air may be sprayed. Note that part of the deuterated water with which the organic film 417 is coated is adsorbed on the surface of the organic film 417. FIG. 1B schematically illustrates the state in which a molecule of the deuterated water is adsorbed on the surface of the organic film 417.

The range in which the organic film 417 is coated with the deuterated water is a range in which at least a conductive film is formed in a subsequent step. There is no particular limitation on the method for coating the organic film 417 with deuterated water, and the following method can be employed: a spin coating method, a dipping method, a spray method, a droplet discharge method (e.g., an ink-jet method), or a printing method (e.g., screen printing or offset printing), or with a tool (equipment) such as a doctor knife, a roll coater, a curtain coater, or a knife coater.

Note that it is preferable to provide a step of removing the moisture adsorbed on the substrate 405 over which the organic film 417 is formed, before the organic film 417 is coated with the deuterated water. This is because when a large amount of moisture other than deuterated water is adsorbed on the substrate 405 provided with the organic film 417, it is difficult to detect at a higher sensitivity a reaction in which a deuterium ion or a deuterium molecule is generated from deuterated water. As a method for removing moisture adsorbed on the substrate 405, for example, heating may be performed at 150° C. in vacuum of lower than or equal to $10^{-4}$ Pa for 30 minutes.

<Fourth Step: Formation of Conductive Film>

Figure 1C:
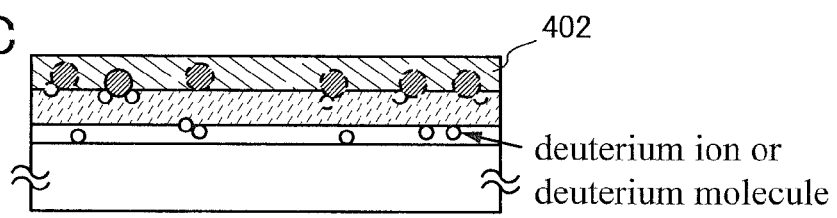

Next, the conductive film 402 is formed on the surface of the organic film 417, on which the deuterated water is adsorbed (see FIG. 1C). Note that FIG. 1C schematically illustrates the state in which the conductive film 402 containing an active metal reduces the deuterated water adsorbed on the surface of the organic film 417 and the generated deuterium ion or deuterium molecule is diffused into the silicon oxide film 416.

As the conductive film 402, a metal film, a conductive oxide film, or the like is selected. As the conductive film 402, for example, a conductive material such as a metal which is less likely to be ionized than hydrogen, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be given.

There is no particular limitation on the method for forming the conductive film 402, and the conductive film 402 can be formed depending on the material by a resistance heating evaporation method, a sputtering method, an electron-beam evaporation method, an ion plating method, or the like.

Note that a sample which is formed by performing the steps up to the third step without formation of the conductive film 402 may be prepared as a comparative sample. An inert conductive material that does not easily generate a hydrogen ion or a hydrogen molecule can be selected by comparing the concentration of the deuterium atoms contained in the silicon oxide film 416 in a sample in which the conductive film 402 is formed with the concentration of the deuterium atoms contained in the silicon oxide film 416 in the comparative sample in which the conductive film 402 is not formed.

<Fifth Step: Measurement of Deuterium Atom Concentration>

Next, the concentration of the deuterium atoms contained in the silicon oxide film 416 is measured by detecting the deuterium atoms by secondary ion mass spectrometry (SIMS). Note that there is no particular limitation on the direction in which the SIMS measurement is performed, and the measurement may be performed toward the substrate 405 from the conductive film 402 or substrate side depth profile secondary ion mass spectrometry (SSDP-SIMS) in which SIMS is performed from the side of the substrate 405 over which the conductive film 402 is not formed may be employed.

Figure 1D:
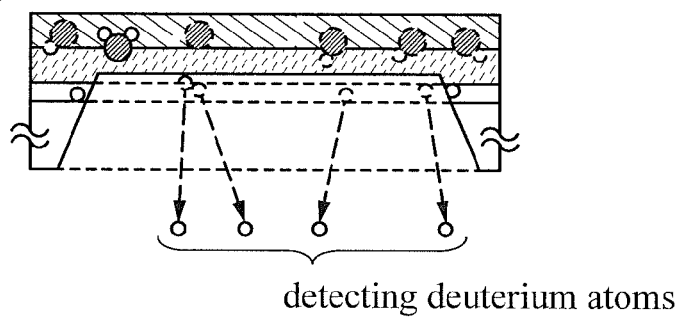
Figure 1E:
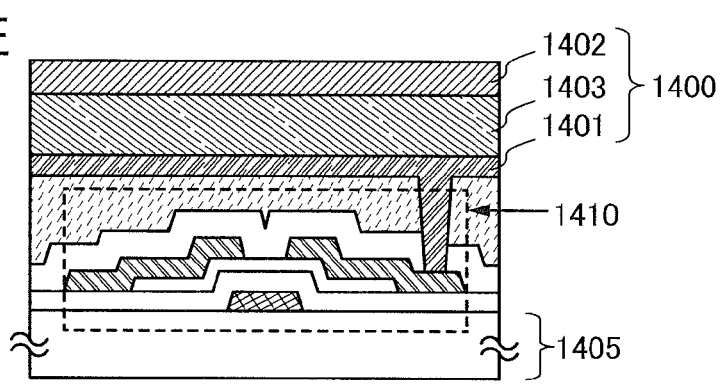

Note that one surface of the substrate 405 in FIG. 1D is deformed in a depressed state because the surface is cut by SSDP-SIMS.

<Sixth Step: Selection of Conductive Material>

Next, as a result of the above SIMS, a conductive material whose concentration of the deuterium atoms contained at the center of the silicon oxide film 416 in the thickness direction is higher than or equal to $1\times10^{15}$ atoms/cm$^3$ and lower than or equal to $1\times10^{17}$ atoms/cm$^3$ is selected. Alternatively, such a conductive material may be selected that the concentration of the deuterium atoms contained in the silicon oxide film 416 in the sample in which the conductive film 402 is formed is substantially equal to the concentration of the deuterium atoms contained in the silicon oxide film 416 in the comparative sample in which the conductive film 402 is not formed.

<Seventh Step: Application of Selected Conductive Film to Second Electrode>

Next, an enhancement transistor 1410 including an oxide semiconductor in a channel formation region is provided over an insulating surface of a substrate 1405; an organic layer 1403 containing a light-emitting substance is formed over a first electrode 1401 electrically connected to a source electrode layer or a drain electrode layer of the enhancement transistor 1410; and a second electrode 1402 is formed in contact with the organic layer 1403 containing a light-emitting substance. Here, as the second electrode, an inert conductive material that reacts with the above deuterated water to a degree that does not easily allows generation of a hydrogen ion or a hydrogen molecule is applied (see FIG. 1E).

Note that it is preferable to provide a step of removing the moisture adsorbed on the substrate 1405 over which the first electrode 1401 is formed, before the organic layer 1403 containing a light-emitting substance is formed over the first electrode 1401. This is because when a large amount of moisture is adsorbed on the substrate 1405 provided with the first electrode 1401, reliability of a light-emitting element provided with an organic layer containing a light-emitting substance between the first electrode and the second electrode is degraded and thus reliability of the whole semiconductor device is degraded. Further, even when an inert conductive film is used for the second electrode, it is preferable to provide a step of removing the moisture adsorbed on the substrate so that possibility that a hydrogen ion or a hydrogen molecule might be generated due to the use over a long period of time is reduced as much as possible. As a method for removing moisture adsorbed on the substrate, for example, heating may be performed at 150° C. in vacuum of lower than or equal to $10^{-4}$ Pa for 30 minutes.

Deuterated water does not substantially penetrate the silicon oxide film 416; therefore, the deuterated water with which the organic film 417 is coated in the third step is adsorbed on the surface of the organic film 417, diffused into the organic film 417, and remains therein. Next, when the conductive film 402 containing an active metal is formed over the organic film 417, the deuterated water adsorbed on the surface of the organic film 417 and the deuterated water diffused from the inside of the organic film 417 are reduced by the conductive film 402 and a deuterium ion or a deuterium molecule is generated. The deuterium ion or the deuterium molecule is diffused into the organic film 417 and can reach the inside of the silicon oxide film 416.

Therefore, according to the this embodiment in which deuterated water containing deuterium atoms at a concentration higher than the concentration of deuterium atoms distributed naturally is used, from the observation of deuterium at a concentration exceeding $1\times10^{17}$ atoms/cm$^3$ in the silicon oxide film 416, the deuterated water adsorbed on the organic film 417 is decomposed by the conductive film 402, that is, the conductive film 402 is active in terms of reduction of water; accordingly, the reduction capability of the conductive film 402 can be evaluated. With this method, a method for designing a highly reliable semiconductor device including an oxide semiconductor, in which an inert conductive material that reacts with water to a degree that does not easily allows generation of a hydrogen ion or a hydrogen molecule can be selected and generation of a hydrogen ion or a hydrogen molecule that increases the carrier concentration of the oxide semiconductor is suppressed, can be provided. Further, a method for designing a highly reliable light-emitting device including an oxide semiconductor can be provided.

This embodiment can be combined with any of the other embodiments in this specification as appropriate.

Embodiment 2

In this embodiment, examples of a structure of an inverted staggered transistor including an oxide semiconductor, a method for manufacturing the transistor and a method for designing a semiconductor device will be described with reference to FIGS. 2A to 2E and FIGS. 3A to 3D. Specifically, an enhancement transistor for design including an oxide semiconductor for design in a channel formation region is formed over an insulating surface of a substrate; an oxide insulating layer for design is formed so as to cover the transistor for design; an organic film for design is formed so as to cover the oxide insulating layer for design; a first electrode for design electrically connected to a source electrode layer or a drain electrode layer of the transistor for design is formed over the organic film for design; the first electrode for design is coated with deuterated water; a conductive film is formed in contact with the first electrode for design; a concentration of deuterium atoms in the oxide semiconductor for design is measured; and a conductive material whose concentration of the deuterium atoms is higher than or equal to $5\times10^{15}$ atoms/cm$^3$ and lower than or equal to $5\times10^{17}$ atoms/cm$^3$ is selected. Next, in a method for designing a semiconductor device, the semiconductor device includes a first electrode electrically connected to a source electrode layer or a drain electrode layer of an enhancement transistor including an oxide semiconductor in a channel formation region, and an organic layer containing a light-emitting substance provided between the first electrode and a second electrode overlapped with the first electrode. A conductive film including the conductive material selected in the above method is applied to the second electrode of the semiconductor device.

Note that the transistor which will be described in this embodiment can be applied to the method for designing the semiconductor device, which is described in Embodiment 1.

<First Step: Formation of Transistor>

FIGS. 2A to 2E show an example of a cross-sectional structure of a transistor including an oxide semiconductor in a channel formation region. A transistor illustrated in FIGS. 2A to 2E is a bottom-gate inverted staggered transistor. Note that in the method for designing a semiconductor device, which will be described in this embodiment, the transistor can be used as a transistor for design. Further, the transistor can also be used for a semiconductor device including a first electrode electrically connected to a source electrode layer or a drain electrode layer of the transistor, and an organic layer containing a light-emitting substance provided between the first electrode and a second electrode overlapped with the first electrode. Note that although the transistor for design, the oxide semiconductor for design, the oxide insulating layer for design, the organic film for design, and the first electrode for design are used in this specification for convenience, whether the above elements are for design or not does not depict the properties of the structure.

An oxide semiconductor used for a semiconductor layer in this embodiment is made to be an i-type (intrinsic) oxide semiconductor or made to be extremely close to an i-type (intrinsic) oxide semiconductor by being highly purified by removing hydrogen, which is an n-type impurity, from an oxide semiconductor so that impurities that are not main components of the oxide semiconductor are contained as little as possible.

Note that the highly purified oxide semiconductor includes extremely few carriers, and the carrier concentration is lower than $1\times10^{14}/cm^3$, preferably lower than $1\times10^{12}/cm^3$, more preferably lower than $1\times10^{11}/cm^3$. Such few carriers enable a current in an off state (off-state current) to be sufficiently small.

Specifically, in the transistor including the oxide semiconductor layer, the leakage current density (off-state current density) per micrometer of a channel width between the source and the drain in an off state can be less than or equal to 100 zA/μm ($1\times10^{-19}$ A/μm), preferably less than or equal to 10 zA/μm ($1\times10^{-20}$ A/μm), and more preferably less than or equal to 1 zA/μm ($1\times10^{-21}$ A/μm) at a source-drain voltage of 3.5 V and at a temperature when the transistor is in use (e.g., 25° C.).

In the transistor including a highly purified oxide semiconductor layer, the temperature dependence of on-state current is hardly observed, and off-state current remains extremely low at a high temperature.

A process of manufacturing the transistor in which an oxide semiconductor is used for a channel formation region over a substrate 505 is described below with reference to FIGS. 2A to 2E.

<1-1. Substrate Having Insulating Surface>

First, a conductive film is formed over the substrate 505 having an insulating surface, and then a gate electrode layer 511 is formed in a first photolithography step. Note that a resist mask may be formed by an ink-jet method. Formation of the resist mask by an ink-jet method needs no photomask; thus, manufacturing cost can be reduced.

There is no particular limitation on the substrate 505 as long as the substrate 505 has a gas barrier property with respect to water vapor and a hydrogen gas and, in the case where heat treatment is performed in a subsequent step, the substrate 505 needs to have at least heat resistance high enough to withstand the heat temperature. For example, a glass substrate of barium borosilicate glass, aluminoborosilicate glass, or the like, a quartz substrate, a sapphire substrate, a ceramic substrate, or the like can be used. Alternatively, a metal substrate containing stainless steel or a semiconductor substrate having an insulating film formed on its surface may be used. There is a tendency that a flexible substrate formed using a synthetic resin such as plastics generally has a lower upper temperature limit than the above substrates; however, such a substrate can be used as long as it can withstand processing temperature in a manufacturing process. Note that the surface of the substrate 505 may be planarized by polishing such as a CMP method.

In this embodiment, a glass substrate is used as the substrate 505 having an insulating surface.

Note that an insulating layer serving as a base may be provided between the substrate 505 and the gate electrode layer 511. The insulating layer has a function of preventing diffusion of an impurity element from the substrate 505, and can be formed to have a stacked-layer structure using one or more films selected from a silicon nitride film, a silicon oxide film, a silicon nitride oxide film, a silicon oxynitride film, and the like.

<1-2. Gate Electrode Layer>

The gate electrode layer 511 can be formed to have a single-layer structure or a stacked-layer structure using a metal material such as molybdenum, titanium, chromium, tantalum, tungsten, neodymium, or scandium, or an alloy material which contains any of these materials as its main component. Note that aluminum or copper can also be used as such a metal material if it can withstand the temperature of heat treatment to be performed in a subsequent process. Aluminum or copper is preferably combined with a refractory metal material so as to prevent a heat resistance problem and a corrosive problem. As the refractory metal material, molybdenum, titanium, chromium, tantalum, tungsten, neodymium, scandium, or the like can be used.

<1-3. Gate Insulating Layer>

Next, a gate insulating layer 507 is formed over the gate electrode layer 511. The gate insulating layer 507 can be formed using a plasma CVD method, a sputtering method, or the like. The gate insulating layer 507 can be formed to have a single-layer structure or a stacked-layer structure using one or more films selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, a tantalum oxide film, a gallium oxide film, and the like.

For the oxide semiconductor in this embodiment, an oxide semiconductor which is made to be an i-type semiconductor or a substantially i-type semiconductor by removing impurities (a highly purified oxide semiconductor) is used. Such a highly purified oxide semiconductor is extremely sensitive to an interface state and interface charge; thus, an interface between the oxide semiconductor layer and the gate insulating layer is important. For that reason, the gate insulating layer in contact with a highly purified oxide semiconductor needs to have high quality.

For example, high-density plasma CVD using microwaves (e.g., with a frequency of 2.45 GHz) is preferably employed because an insulating layer can be dense and have high withstand voltage and high quality. This is because the highly purified oxide semiconductor and the high-quality gate insulating layer are in close contact with each other, whereby the interface state density can be reduced to obtain favorable interface characteristics.

Needless to say, another film formation method such as a sputtering method or a plasma CVD method can be employed as long as the method enables formation of a favorable insulating layer as a gate insulating layer. Further, an insulating layer whose film quality and characteristic of the interface between the insulating layer and the oxide semiconductor are improved by heat treatment which is performed after formation of the insulating layer may be formed as a gate insulating layer. In any case, any insulating layer may be used as long as the insulating layer has characteristics of enabling reduction in interface state density of the interface between the insulating layer and the oxide semiconductor and formation of a favorable interface as well as having favorable film quality as the gate insulating layer.

The gate insulating layer 507 is in contact with an oxide semiconductor layer to be subsequently formed. When hydrogen is contained in the oxide semiconductor, characteristics of the transistor are adversely affected; therefore, it is preferable that the gate insulating layer 507 do not contain hydrogen, hydroxyl, and moisture. In order to prevent the gate insulating layer 507 and an oxide semiconductor film 530 from containing hydrogen, hydroxyl, and moisture as much as possible, it is preferable to preheat the substrate 505 provided with the gate electrode layer 511 or the substrate 505 provided with the gate electrode layer 511 and the gate insulating layer 507 in a preheating chamber of a sputtering apparatus before formation of the oxide semiconductor film 530 so that impurities such as hydrogen or moisture adsorbed on the substrate 505 is eliminated, and then perform exhaustion. The temperature for the preheating is higher than or equal to 100° C. and lower than or equal to 400° C., preferably higher than or equal to 150° C. and lower than or equal to 300° C. As an exhaustion unit provided in the preheating chamber, a cryopump is preferable. Note that this preheating treatment can be omitted. Further, this preheating treatment may be performed in a similar manner on the substrate 505 over which layers up to and including a source electrode layer 515a and a drain electrode layer 515b are formed before formation of an insulating layer 516.

<1-4. Oxide Semiconductor Layer>

Figure 2A:
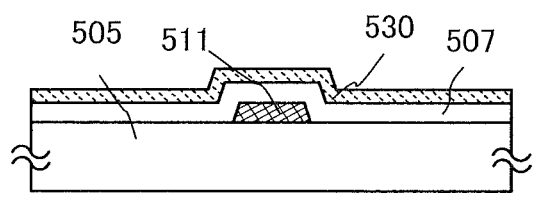
FIGS. 2A to 2E are cross-sectional views illustrating a manufacturing process of a transistor according to an embodiment.

Next, over the gate insulating layer 507, the oxide semiconductor film 530 having a thickness of greater than or equal to 2 nm and less than or equal to 200 nm, preferably greater than or equal to 5 nm and less than or equal to 30 nm is formed (see FIG. 2A).

The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

Note that before the oxide semiconductor film 530 is formed by a sputtering method, powdery substances (also referred to as particles or dust) attached to a surface of the gate insulating layer 507 are preferably removed by reverse sputtering in which plasma is generated by introduction of an argon gas. The reverse sputtering refers to a method in which an RF power supply is used for application of voltage to a substrate side under an argon atmosphere and plasma is generated around the substrate to modify a surface. Note that instead of an argon atmosphere, a nitrogen atmosphere, a helium atmosphere, an oxygen atmosphere, or the like may be used.

As an oxide semiconductor used for the oxide semiconductor film 530, any of the following metal oxides can be used: a four-component metal oxide such as an In—Sn—Ga—Zn—O-based oxide semiconductor; three-component metal oxides such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; two-component metal oxides such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor; an In—O-based oxide semiconductor; a Sn—O-based oxide semiconductor; a Zn—O-based oxide semiconductor; and the like. Further, the oxide semiconductor layer may contain silicon oxide. Addition of silicon oxide ($SiO_x$ (x>0)) which hinders crystallization into the oxide semiconductor layer can suppress crystallization of the oxide semiconductor layer at the time when heat treatment is performed after formation of the oxide semiconductor layer in the manufacturing process. The oxide semiconductor layer preferably exists in an amorphous state; however, the oxide semiconductor layer may be partly crystallized. In this specification, for example, an In—Ga—Zn—O-based oxide semiconductor means an oxide film containing indium (In), gallium (Ga), and zinc (Zn), and there is no particular limitation on the composition ratio. The In—Ga—Zn—O-based oxide semiconductor may contain an element other than In, Ga, and Zn.

In addition, for the oxide semiconductor film 530, a thin film of a material represented by the chemical formula, $InMO_3(ZnO)_m$ (m>0), can be used. Here, M represents one or more metal elements selected from Ga, Al, Mn, and Co. For example, M can be Ga, Ga and Al, Ga and Mn, Ga and Co, or the like.

The oxide semiconductor preferably includes In, more preferably includes In and Ga. In order to obtain an i-type (intrinsic) oxide semiconductor, dehydration or dehydrogenation is effective. In this embodiment, the oxide semiconductor film 530 is formed by a sputtering method using an In—Ga—Zn—O-based oxide semiconductor target. A cross-sectional view of this stage corresponds to FIG. 2A.

As the target for forming the oxide semiconductor film 530 by a sputtering method, for example, an oxide target having a composition ratio of $In_2O_3:Ga_2O_3:ZnO=1:1:1$ [molar ratio] is used to form an In—Ga—Zn—O film. Without limitation to the material and the composition of the above target, for example, an oxide target having a composition ratio of $In_2O_3:Ga_2O_3:ZnO=1:1:2$ [molar ratio] or $In_2O_3:Ga_2O_3:ZnO=1:1:4$ [molar ratio] may be used.

Furthermore, the filling rate of the oxide target is greater than or equal to 90% and less than or equal to 100%, preferably greater than or equal to 95% and less than or equal to 99.9%. With use of the metal oxide target with high filling factor, a dense oxide semiconductor film can be formed.

It is preferable that a high-purity gas from which impurities such as hydrogen, water, hydroxyl, or hydride is removed be used as a sputtering gas used for the formation of the oxide semiconductor film 530.

The substrate is held in a film formation chamber kept under reduced pressure, and the substrate temperature is set to a temperature of higher than or equal to 100° C. and lower than or equal to 600° C., preferably higher than or equal to 200° C. and lower than or equal to 400° C. Film formation is performed while the substrate is heated, whereby the concentration of impurities contained in the oxide semiconductor film formed can be reduced. In addition, damage by sputtering can be reduced. Then, a sputtering gas from which hydrogen and moisture have been removed is introduced into the film formation chamber while moisture remaining therein is removed, and the oxide semiconductor film 530 is formed over the substrate 505 with the use of the above target. In order to remove moisture remaining in the film formation chamber, an entrapment vacuum pump such as a cryopump, an ion pump, or a titanium sublimation pump is preferably used. The exhaustion unit may be a turbo pump provided with a cold trap. In the film formation chamber which is exhausted with the cryopump, a hydrogen atom, a compound containing a hydrogen atom, such as water ($H_2O$), (more preferably, also a compound containing a carbon atom), and the like are removed, whereby the concentration of impurities contained in the oxide semiconductor film formed in the film formation chamber can be reduced.

The atmosphere for sputtering may be a rare gas (typically argon) atmosphere, an oxygen atmosphere, or a mixed atmosphere containing a rare gas and oxygen.

As one example of the film formation condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current power source is preferably used, in which case powder substances (also referred to as particles or dust) that are generated in film formation can be reduced and the film thickness can be uniform.

Note that impurities, for example, an alkali metal such as Li or Na and an alkaline earth metal such as Ca contained in the oxide semiconductor layer are preferably reduced. Specifically, the concentrations of Li and K detected by SIMS are each lower than or equal to $5 \times 10^{15}$ cm$^{-3}$, preferably lower than or equal to $1 \times 10^{15}$ cm$^{-3}$.

An alkali metal and an alkaline earth metal are adverse impurities for the oxide semiconductor and are preferably contained as little as possible. An alkali metal, in particular, Na diffuses into an oxide and becomes Na$^+$ when an insulating film in contact with the oxide semiconductor is an oxide. In addition, Na cuts a bond between metal and oxygen or enters the bond in the oxide semiconductor. As a result, transistor characteristics deteriorate (e.g., the transistor becomes normally-on (the shift of a threshold voltage to a negative side) or the mobility is decreased). In addition, this also causes variation in the characteristics. Such a problem is significant especially in the case where the hydrogen concentration in the oxide semiconductor is extremely low. Therefore, the concentration of an alkali metal is strongly required to set to the above value in the case where the hydrogen concentration in the oxide semiconductor is lower than or equal to $5 \times 10^{19}$ cm$^{-3}$, particularly lower than or equal to $5 \times 10^{18}$ cm$^{-3}$.

Next, the oxide semiconductor film 530 is processed into an island-shaped oxide semiconductor layer in a second photolithography step. A resist mask for forming the island-shaped oxide semiconductor layer may be formed by an ink-jet method. Formation of the resist mask by an ink-jet method needs no photomask; thus, manufacturing cost can be reduced.

In the case where a contact hole is formed in the gate insulating layer 507, a step of forming the contact hole can be performed at the same time as processing of the oxide semiconductor film 530.

Note that etching of the oxide semiconductor film 530 may be dry etching or wet etching, or both dry etching and wet etching. As an etchant used for wet etching of the oxide semiconductor film 530, for example, a mixed solution of phosphoric acid, acetic acid, and nitric acid can be used. In addition, ITO07N (produced by KANTO CHEMICAL CO., INC.) may also be used.

As an etching gas used for dry etching, a gas containing chlorine (e.g., a chlorine-based gas such as chlorine ($Cl_2$), boron trichloride ($BCl_3$), silicon tetrachloride ($SiCl_4$), or carbon tetrachloride ($CCl_4$)) is preferable. Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

Next, the oxide semiconductor layer is subjected to first heat treatment. The oxide semiconductor layer can be dehydrated or dehydrogenated by this first heat treatment. The temperature of the first heat treatment is higher than or equal to 250° C. and lower than or equal to 750° C., preferably higher than or equal to 400° C. and lower than the strain point of the substrate. For example, heat treatment may be performed at 500° C. for approximately longer than or equal to three minutes and shorter than or equal to six minutes. When using an RTA (rapid thermal anneal) method for the heat treatment, dehydration or dehydrogenation can be performed in a short time; therefore, the treatment can be performed even at a temperature of higher than the strain point of the glass substrate.

Figure 2B:
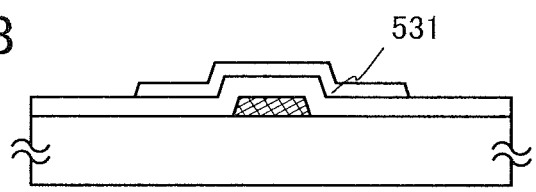
Figure 2C:
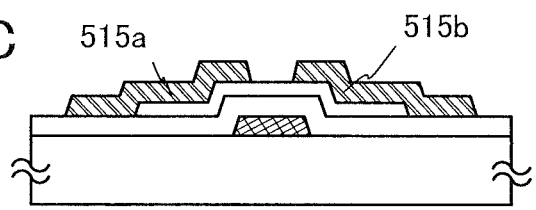

Here, the substrate is put in an electric furnace which is a kind of heat treatment apparatus and heat treatment is performed on the oxide semiconductor layer at 450° C. under a nitrogen atmosphere for 1 hour, and then water or hydrogen is prevented from entering the oxide semiconductor layer without exposure to the air; thus, an oxide semiconductor layer 531 is obtained (see FIG. 2B).

Further, a heat treatment apparatus used is not limited to an electric furnace, and a device for heating an object to be processed by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, for example, nitrogen or a rare gas such as argon is used.

For example, as the first heat treatment, GRTA by which the substrate is moved into an inert gas heated to a high temperature as high as 650° C. to 700° C., heated for several minutes, and moved out of the inert gas heated to the high temperature may be performed.

Note that in the first heat treatment, it is preferable that water, hydrogen, and the like be not contained in the atmosphere of nitrogen or a rare gas such as helium, neon, or argon. Alternatively, it is preferable that the purity of nitrogen or the rare gas such as helium, neon, or argon which is introduced into a heat treatment apparatus be set to be higher than or equal to 6N (99.9999%), more preferably higher than or equal to 7N (99.99999%) (that is, the concentration of impurities is lower than or equal to 1 ppm, preferably lower than or equal to 0.1 ppm).

In addition, after the oxide semiconductor layer is heated by the first heat treatment, a high-purity oxygen gas, a high-purity $N_2O$ gas, or ultra dry air (the amount of moisture is less than or equal to 20 ppm (−55° C. by conversion into a dew point), preferably less than or equal to 1 ppm, or more preferably less than or equal to 10 ppb, in the case where measurement is performed with the use of a dew point meter of a cavity ring down laser spectroscopy (CRDS) system) may be introduced into the same furnace. It is preferable that the oxygen gas and the $N_2O$ gas do not include water, hydrogen, and the like. The purity of the oxygen gas or the $N_2O$ gas that is introduced into the heat treatment apparatus is preferably higher than or equal to 6N, more preferably higher than or equal to 7N (i.e., the concentration of impurities in the oxygen gas or the $N_2O$ gas is preferably lower than or equal to 1 ppm, more preferably lower than or equal to 0.1 ppm). Oxygen which is one of main components of the oxide semiconductor and has been reduced because of the step of removing impurities through the dehydration or the dehydrogenation is supplied with the use of an effect of an oxygen gas or an N₂O gas, whereby the oxide semiconductor layer is highly purified and made to be electrically i-type (intrinsic).

The first heat treatment for the oxide semiconductor layer can also be performed on the oxide semiconductor film 530 which has not yet been processed into the island-shaped oxide semiconductor layer. In that case, the substrate is taken out from the heat treatment apparatus after the first heat treatment, and then a photolithography step is performed.

Note that the first heat treatment may be performed at either of the following timings without limitation to the above-described timing as long as it is performed after the oxide semiconductor layer is formed: after the source electrode layer and the drain electrode layer are formed over the oxide semiconductor layer; and after the insulating layer is formed over the source electrode layer and the drain electrode layer.

In the case where a contact hole is formed in the gate insulating layer 507, the formation of the contact hole may be performed before or after the first heat treatment is performed on the oxide semiconductor film 530.

Through the above process, the concentration of hydrogen in the island-shaped oxide semiconductor layer can be reduced and the island-shaped oxide semiconductor layer can be highly purified. Accordingly, stability of the oxide semiconductor layer can be achieved. In addition, heat treatment at a temperature of lower than or equal to the glass transition temperature makes it possible to form an oxide semiconductor film with a wide band gap, in which carrier density is extremely low. Therefore, the transistor can be manufactured using a large-area substrate, so that the productivity can be increased. In addition, by using the oxide semiconductor film in which the hydrogen concentration is reduced and the purity is improved, it is possible to manufacture a transistor with high withstand voltage and an extremely small off-state current. The above heat treatment can be performed at any time as long as it is performed after the oxide semiconductor layer is formed.

In addition, as the oxide semiconductor layer, an oxide semiconductor layer having a crystal region with a large thickness (a single crystal region), that is, a crystal region which is c-axis-aligned perpendicularly to a surface of the film may be formed by performing film formation twice and heat treatment twice, even when any of an oxide, a nitride, a metal, or the like is used for a material of a base component. For example, a first oxide semiconductor film having a thickness of greater than or equal to 3 nm and less than or equal to 15 nm is formed and then first heat treatment is performed at a temperature of higher than or equal to 450° C. and lower than or equal to 850° C., preferably higher than or equal to 550° C. and lower than or equal to 750° C. under an atmosphere of nitrogen, oxygen, a rare gas, or dry air, whereby a first oxide semiconductor film which includes a crystalline region (including plate-like crystals) in a region including its surface is formed. Then, a second oxide semiconductor film which is thicker than the first oxide semiconductor film is formed and then second heat treatment is performed at a temperature of higher than or equal to 450° C. and lower than or equal to 850° C., preferably higher than or equal to 600° C. and lower than or equal to 700° C., so that crystal growth proceeds upward with the use of the first oxide semiconductor film as a seed of the crystal growth, whereby the whole second oxide semiconductor film is crystallized. In such a manner, an oxide semiconductor layer which includes a thick crystalline region may be formed.

<1-5. Source Electrode Layer and Drain Electrode Layer>

Next, a conductive film which serves as a source electrode layer and a drain electrode layer (including a wiring formed using the same layer as the source electrode layer and the drain electrode layer) is formed over the gate insulating layer 507 and the oxide semiconductor layer 531. As the conductive film used for the source electrode layer and the drain electrode layer, for example, a metal film including an element selected from Al, Cr, Cu, Ta, Ti, Mo, and W, an alloy or a metal nitride film including any of the above elements as its component (e.g., a titanium nitride film, a molybdenum nitride film, or a tungsten nitride film), or the like can be used. In addition, in order to solve a heat resistance problem and a corrosive problem, a structure in which a film of a metal such as Al or Cu has, on one of or on both the bottom side and the top side, a film of refractory metal such as Ti, Mo, W, Cr, Ta, Nd, Sc, or Y, or a metal nitride film thereof (e.g., a titanium nitride film, a molybdenum nitride film, or a tungsten nitride film) may be used.

Further, the conductive film may have a single-layer structure or a stacked-layer structure of two or more layers. For example, a single-layer structure of an aluminum film containing silicon; a two-layer structure of an aluminum film and a titanium film stacked thereover; a three-layer structure in which a titanium film, an aluminum film, and a titanium film are stacked in this order; and the like can be given.

Alternatively, the conductive film may be formed using conductive metal oxide. As the conductive metal oxide, indium oxide, tin oxide, zinc oxide, an alloy of indium oxide and tin oxide, an alloy of indium oxide and zinc oxide, or the conductive metal oxide material containing silicon or silicon oxide can be used.

Note that in the case where heat treatment is performed after the conductive film is formed, the conductive film preferably has heat resistance high enough to withstand the heat treatment.

Subsequently, in a third photolithography step, a resist mask is formed over the conductive film, and selective etching is performed, so that the source electrode layer 515a and the drain electrode layer 515b are formed. Then, the resist mask is removed (see FIG. 2C).

Light exposure at the time of the formation of the resist mask in the third photolithography step may be performed using ultraviolet light, KrF laser light, or ArF laser light. A channel length L of a transistor which is subsequently formed is determined by a distance between bottom ends of the source electrode layer and the drain electrode layer, which are adjacent to each other over the oxide semiconductor layer 531. In the case where light exposure is performed for a channel length L of shorter than 25 nm, the light exposure at the time of the formation of the resist mask in the third photolithography step may be performed using extreme ultraviolet light having an extremely short wavelength of several nanometers to several tens of nanometers. In the light exposure by extreme ultraviolet light, the resolution is high and the focus depth is large. Thus, the channel length L of the transistor which is subsequently formed can be longer than or equal to 10 nm and shorter than or equal to 1000 nm and the operation speed of a circuit can be increased.

Note that it is preferable that etching conditions be optimized so as not to etch and divide the oxide semiconductor layer 531 when the conductive film is etched. However, it is difficult to obtain conditions under which only the conductive film is etched and the oxide semiconductor layer 531 is not etched at all. Therefore, in some cases, only part of the oxide semiconductor layer 531 is etched to be an oxide semiconductor layer having a groove (a depressed portion) at the time of etching of the conductive film.

In this embodiment, a Ti film is used as the conductive film and an In—Ga—Zn—O-based oxide semiconductor is used for the oxide semiconductor layer 531; therefore, an ammonia hydrogen peroxide mixture (a mixed solution of ammonia, water, and a hydrogen peroxide solution) is used as an etchant. When the ammonia hydrogen peroxide mixture is used as an etchant, the conductive film can be selectively etched.

<1-6. First Insulating Layer>

Next, by plasma treatment using a gas such as $N_2O$, $N_2$, or Ar, water or the like adsorbed on a surface of an exposed portion of the oxide semiconductor layer may be removed. Plasma treatment may be performed using a mixture gas of oxygen and argon as well. In the case where the plasma treatment is performed, the insulating layer 516 which serves as a protective insulating film which is in contact with part of the oxide semiconductor layer is formed without being exposed to air.

The insulating layer 516 preferably contains as little impurities such as moisture, hydrogen, and oxygen as possible, and may be formed using an insulating film of a single layer or a stack of plural insulating films. The insulating layer 516 can be formed to a thickness of at least 1 nm by a method by which impurities such as water and hydrogen are not mixed into the insulating layer 516, such as a sputtering method, as appropriate. When hydrogen is contained in the insulating layer 516, the hydrogen enters the oxide semiconductor layer or extracts oxygen from the oxide semiconductor layer, which causes a reduction in resistance of a back channel of the oxide semiconductor layer (i.e., makes an n-type back channel), so that a parasitic channel might be formed. Therefore, it is important that a film formation method in which hydrogen is not used be employed so that the insulating layer 516 contains as little hydrogen as possible.

The insulating layer 516 is preferably formed using a material having a high barrier property. For example, a silicon nitride film, a silicon nitride oxide film, an aluminum nitride film, an aluminum nitride oxide film, an aluminum oxide film, a gallium oxide film, or the like can be used as the insulating film having a high barrier property. By using the insulating film having a high barrier property, impurities such as moisture or hydrogen can be prevented from entering the island-shaped oxide semiconductor layer, the gate insulating layer, or the interface between the island-shaped oxide semiconductor layer and another insulating layer and the vicinity thereof.

For example, an insulating film having a structure in which an aluminum oxide film having a thickness of 100 nm formed by a sputtering method is stacked over a gallium oxide film having a thickness of 200 nm formed by a sputtering method may be formed. The substrate temperature in film formation is in the range of room temperature to 300° C. Further, the insulating film preferably contains much oxygen that exceeds the stoichiometric proportion, more preferably contains oxygen more than 1 time and less than two times the stoichiometric proportion. When the insulating film contains excessive oxygen in such a manner, oxygen is supplied to the interface with the island-shaped oxide semiconductor film; thus, oxygen deficiency can be reduced.

In this embodiment, a silicon oxide film having a thickness of 200 nm is formed as the insulating layer 516 by a sputtering method. The substrate temperature in film formation may be higher than or equal to room temperature and lower than or equal to 300° C. and is 100° C. in this embodiment. The silicon oxide film can be formed by a sputtering method under a rare gas (typically argon) atmosphere, an oxygen atmosphere, or a mixed atmosphere containing a rare gas and oxygen. Further, a silicon oxide target or a silicon target can be used as a target. For example, the silicon oxide film can be formed under an atmosphere containing oxygen by a sputtering method using a silicon target. As the insulating layer 516 which is formed in contact with the oxide semiconductor layer, an inorganic insulating film which does not contain impurities such as moisture, a hydrogen ion, and $OH^-$ and blocks the entry of these impurities from the outside is used. Typically, a silicon oxide film, a silicon oxynitride film, an aluminum oxide film, an aluminum oxynitride film, or the like is used.

As in the case where the oxide semiconductor film 530 is formed, an entrapment vacuum pump (e.g., a cryopump) is preferably used in order to remove moisture remaining in a film formation chamber used for forming the insulating layer 516. The insulating layer 516 is formed in the film formation chamber which is exhausted with a cryopump, whereby the concentration of impurities in the insulating layer 516 can be reduced. A turbo pump provided with a cold trap may be used as an exhaustion unit for removing moisture remaining in the film formation chamber used for forming the insulating layer 516.

It is preferable that a high-purity gas from which impurities such as hydrogen, water, hydroxyl, or hydride is removed be used as a sputtering gas for the formation of the insulating layer 516.

Note that second heat treatment may be performed after the insulating layer 516 is formed. The heat treatment is performed under a nitrogen atmosphere, an atmosphere of ultra-dry air, or a rare gas (e.g., argon and helium) atmosphere at preferably a temperature of higher than or equal to 200° C. and lower than or equal to 400° C., for example, higher than or equal to 250° C. and lower than or equal to 350° C. It is preferable that the content of water in the gas be less than or equal to 20 ppm, preferably less than or equal to 1 ppm, or more preferably less than or equal to 10 ppb. For example, the heat treatment is performed at 250° C. under a nitrogen atmosphere for 1 hour. Alternatively, RTA treatment may be performed at a high temperature for a short time as in the first heat treatment. Even when oxygen deficiency is generated in the island-shaped oxide semiconductor layer by the first heat treatment, by performing heat treatment after the insulating layer 516 containing oxygen is provided; oxygen is supplied to the island-shaped oxide semiconductor layer from the insulating layer 516. By supplying oxygen to the island-shaped oxide semiconductor layer, oxygen deficiency that serves as a donor is reduced in the island-shaped oxide semiconductor layer, and the island-shaped oxide semiconductor layer preferably contains oxygen whose amount is greater than that in the stoichiometric proportion. As a result, the island-shaped oxide semiconductor layer can be made to be substantially i-type and variation in electric characteristics of the transistor due to oxygen deficiency can be reduced, which results in improvement in electric characteristics. The timing of this second heat treatment is not particularly limited as long as it is after the formation of the insulating layer 516, and this second heat treatment can be performed without increasing the number of steps by serving as another step such as heat treatment in formation of a resin film or heat treatment for reduction of the resistance of a light-transmitting conductive film, and thereby the island-shaped oxide semiconductor layer can be made to be substantially i-type.

Moreover, the oxygen deficiency that serves as a donor in the island-shaped oxide semiconductor layer may be reduced by subjecting the island-shaped oxide semiconductor layer to the heat treatment under an oxygen atmosphere so that oxygen is added to the oxide semiconductor. The heat treatment is performed at a temperature of higher than or equal to 100° C. and lower than 350° C., preferably higher than or equal to 150° C. and lower than 250° C., for example. It is preferable that an oxygen gas used for the heat treatment under an oxygen atmosphere do not include water, hydrogen, or the like. Alternatively, it is preferable that the purity of the oxygen gas which is introduced into the heat treatment apparatus be set to be higher than or equal to 6N (99.9999%), more preferably higher than or equal to 7N (99.99999%) (that is, the impurity concentration in the oxygen is lower than or equal to 1 ppm, preferably lower than or equal to 0.1 ppm).

In this embodiment, the second heat treatment (preferably at a temperature of higher than or equal to 200° C. and lower than or equal to 400° C., for example, higher than or equal to 250° C. and lower than or equal to 350° C.) is performed under an inert gas atmosphere or an oxygen gas atmosphere. For example, the second heat treatment is performed at 250° C. under a nitrogen atmosphere for 1 hour. In the second heat treatment, part of the oxide semiconductor layer (a channel formation region) is heated while being in contact with the insulating layer 516.

Through the above process, the first heat treatment is performed on the oxide semiconductor film, whereby impurities such as hydrogen, moisture, hydroxyl, or hydride (also referred to as a hydrogen compound) can be intentionally eliminated from the oxide semiconductor layer and oxygen, which is one of main components of the oxide semiconductor but has been reduced through the step of eliminating the impurities, can be supplied. Thus, the oxide semiconductor layer is highly purified and made to be electrically i-type (intrinsic).

Figure 2D:
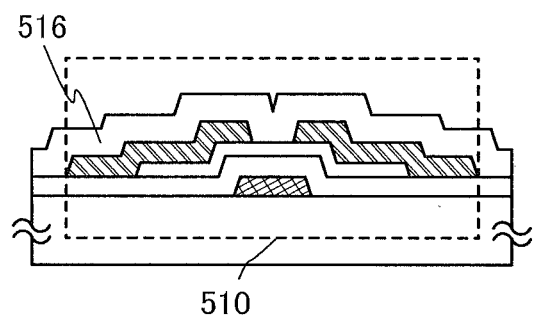
Figure 2E:
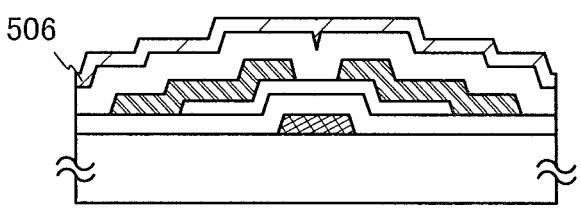

Through the above process, the transistor is formed (see FIG. 2D). The transistor, which has a channel-etched structure, includes the gate electrode layer 511, the gate insulating layer 507 over the gate electrode layer 511, the island-shaped oxide semiconductor layer 531 which is over the gate insulating layer 507 and overlaps with the gate electrode layer 511, and a pair of the source electrode layer 515a and the drain electrode layer 515b formed over the island-shaped oxide semiconductor layer 531.

When a silicon oxide layer having a number of defects is used as the insulating layer 516, heat treatment after formation of the silicon oxide layer has an effect in diffusing impurities such as hydrogen, moisture, hydroxyl, or hydride contained in the oxide semiconductor layer into the oxide insulating layer so that the impurities contained in the oxide semiconductor layer can be further reduced.

In addition, when a silicon oxide layer containing excessive oxygen is used as the insulating layer 516, oxygen in the insulating layer 516 is moved to the oxide semiconductor layer 531 by the heat treatment performed after the formation of the insulating layer 516, so that the oxygen concentration in the oxide semiconductor layer 531 can be improved and the oxide semiconductor layer 531 can be highly purified.

A protective insulating layer 506 may be additionally stacked over the insulating layer 516. As the protective insulating layer 506, for example, a silicon nitride film is formed by an RF sputtering method. Since an RF sputtering method has high productivity, it is preferably used as a film formation method of the protective insulating layer. As the protective insulating layer, an inorganic insulating film which does not contain impurities such as moisture and blocks the entry of the impurities from the outside is used; for example, a silicon nitride film, an aluminum nitride film, or the like is used. In this embodiment, the protective insulating layer 506 is formed using a silicon nitride film (see FIG. 2E).

In this embodiment, as the protective insulating layer 506, a silicon nitride film is formed by heating the substrate 505, over which layers up to the insulating layer 516 are formed, to a temperature of 100° C. to 400° C., introducing a sputtering gas containing high-purity nitrogen from which hydrogen and moisture are removed, and using a target of silicon semiconductor. In this case, the protective insulating layer 506 is preferably formed while moisture remaining in a treatment chamber is removed, in a manner similar to that of the insulating layer 516.

After the formation of the protective insulating layer, heat treatment may be further performed at a temperature of higher than or equal to 100° C. and lower than or equal to 200° C. in the air for longer than or equal to 1 hour and shorter than or equal to 30 hours. This heat treatment may be performed at a fixed heating temperature. Alternatively, the following change in the heating temperature may be performed plural times repeatedly: the heating temperature is increased from room temperature to a temperature of higher than or equal to 100° C. and lower than or equal to 200° C. and then decreased to room temperature.

Oxygen-dope treatment may be performed on the oxide semiconductor film 530 and/or oxygen plasma-dope treatment may be performed on the gate insulating layer 507. Note that the "oxygen doping" means that oxygen (which includes at least one of an oxygen radical, an oxygen atom, and an oxygen ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

The oxygen plasma-dope treatment may be either a method by which oxygen which is made to be plasma by inductively coupled plasma (ICP) is added or a method by which oxygen which is made to be plasma with the use of a microwave whose frequency is 1 GHz or higher (e.g., a frequency of 2.45 GHz) is added.

<1-7. Second Insulating Layer>

A second insulating layer 517 for planarization may be provided over the insulating layer 516 (the protective insulating layer 506 in the case where the protective insulating layer 506 is stacked). Note that for the second insulating layer 517, a resin material such as polyimide, acrylic, benzocyclobutene resin, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the second insulating layer 517 may be formed by stacking a plurality of insulating films formed using any of these materials. There is no particular limitation on the formation method of the second insulating layer 517, and the following method can be employed depending on the material: a sputtering method, an SOG method, spin coating, dip coating, a spray method, or a droplet discharging method (e.g., an ink-jet method), a printing method (e.g., screen printing or offset printing), or with a tool (equipment) such as a doctor knife, a roll coater, a curtain coater, or a knife coater.

<Second Step: Formation of First Electrode>

Next, an opening 518 which reaches the source electrode layer 515a or the drain electrode layer 515b is formed in the insulating layer 516 (the protective insulating layer 506 in the case where the protective insulating layer 506 is formed) and the second insulating layer 517. A conductive film is formed over the insulating layer 516, and a first electrode 601 is formed by patterning. The first electrode is connected to the source electrode layer 515a or the drain electrode layer 515b through the opening 518 (see FIG. 3A). Further, as the first electrode 601, the conductive film that can be used for the gate electrode layer 511, the conductive film that can be used for the source electrode layer and the drain electrode layer, a conductive film which transmits visible light, or the like can be used. As the conductive film which transmits visible light, for example, a conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or graphene can be given.

Note that a back gate electrode may be fanned in a position overlapping with the island-shaped oxide semiconductor layer by patterning the conductive film. In the case where the back gate electrode is formed, an insulating layer is preferably formed to cover the back gate electrode. The back gate electrode can be formed using a material and a structure similar to those of the gate electrode layer and the source electrode layer and the drain electrode layer.

The thickness of the back gate electrode is set to be 10 nm to 400 nm, preferably 100 nm to 200 nm. For example, the back gate electrode is preferably formed in a such a manner that a conductive film in which a titanium film, an aluminum film, and a titanium film are stacked is formed, a resist mask is formed by a photolithography method or the like, and unnecessary portions are removed by etching so that the conductive film is processed (patterned) to a desired shape. The back gate electrode also functions as a light-blocking film, whereby photodegradation of the transistor, such as negative-bias stress photodegradation, can be reduced and the reliability can be increased.

Through the above steps, the enhancement transistor including an oxide semiconductor in a channel formation region, which is provided with the first electrode electrically connected to the source electrode layer or the drain electrode layer, can be manufactured.

<Third Step: Coating with Deuterated Water>

The enhancement transistor including an oxide semiconductor in a channel formation region, which is manufactured by the above method, is used as a transistor 510 for design. In this embodiment, a first electrode electrically connected to a source electrode layer or a drain electrode layer of the transistor 510 for design is used as a first electrode 601 for design.

Figure 3A:
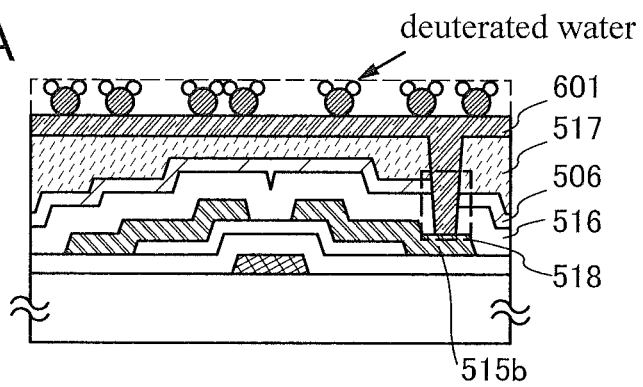
FIGS. 3A to 3D are cross-sectional views illustrating a method for designing a semiconductor device according to an embodiment.

Next, the first electrode 601 for design is coated with deuterated water. After the first electrode 601 for design is held at a temperature lower than room temperature for a certain time (e.g., 10 minutes), the deuterated water is removed. As a method for removing the deuterated water, for example, dry air may be sprayed. Note that part of the deuterated water with which the first electrode 601 for design is coated is adsorbed on the surface of the first electrode 601 for design. FIG. 3A schematically illustrates the state in which a molecule of the deuterated water is adsorbed on the surface of the first electrode 601 for design.

The range in which the first electrode 601 for design is coated with the deuterated water is a range in which at least a conductive film is formed in a subsequent step. There is no particular limitation on the method for coating the first electrode 601 for design with deuterated water, and the following method can be employed depending on the material: a spin coating method, a dipping method, a spray method, or a droplet discharge method (e.g., an ink-jet method), a printing method (e.g., screen printing or offset printing), or with a tool (equipment) such as a doctor knife, a roll coater, a curtain coater, or a knife coater.

<Fourth Step: Formation of Conductive Film>

Figure 3B:
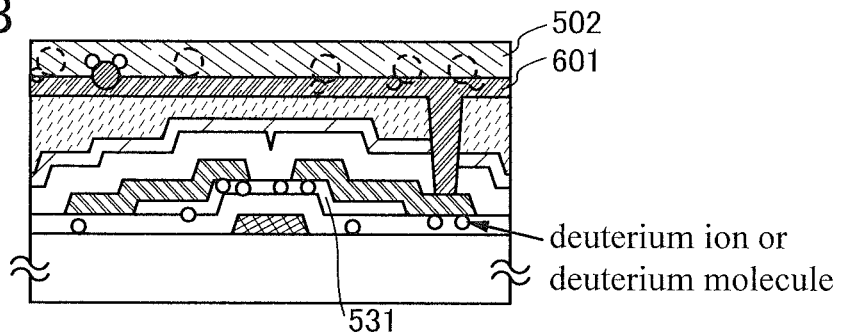

Next, a conductive film 502 is formed on the surface of the first electrode 601 for design which is coated with deuterated water. Note that FIG. 3B schematically illustrates the state in which the conductive film 502 containing an active metal reduces the deuterated water adsorbed on the surface of the first electrode 601 for design and the generated deuterium ion or deuterium molecule is diffused into the transistor 510 for design and reaches the inside of the oxide semiconductor layer 531.

As the conductive film 502, for example, a metal film or a conductive oxide film can be used. Specifically, a conductive material such as a metal which is less likely to be ionized than hydrogen, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or graphene can be given.

There is no particular limitation on the method for forming the conductive film 502, and the conductive film 502 can be formed depending on the material by a resistance heating evaporation method, a sputtering method, an electron-beam evaporation method, an ion plating method, or the like.

Note that a sample which is formed by performing the steps up to the third step without formation of the conductive film 502 may be prepared as comparative sample. An inert conductive material that does not easily generate a hydrogen ion or a hydrogen molecule can be selected by comparing the concentration of the deuterium atoms contained in a sample in which the conductive film 502 is formed with a concentration of the deuterium atoms contained in the comparative sample in which the conductive film 502 is not formed.

<Fifth Step: Measurement of Deuterium Atom Concentration>

Next, the concentration of the deuterium atoms contained at the center of the oxide semiconductor layer 531 in the thickness direction is measured by detecting the deuterium atoms by secondary ion mass spectrometry (SIMS). Note that there is no particular limitation on the direction in which the SIMS measurement is performed, and the measurement may be performed toward the substrate 505 from the conductive film 502 or substrate side depth profile secondary ion mass spectrometry (SSDP-SIMS) in which SIMS is performed from the side of the substrate 505 over which the conductive film 502 is not formed may be employed.

Figure 3C:
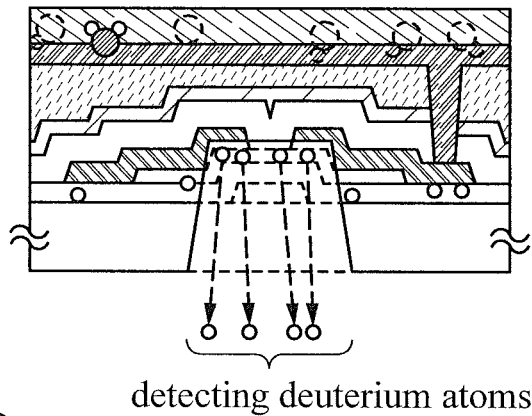
Figure 3D:
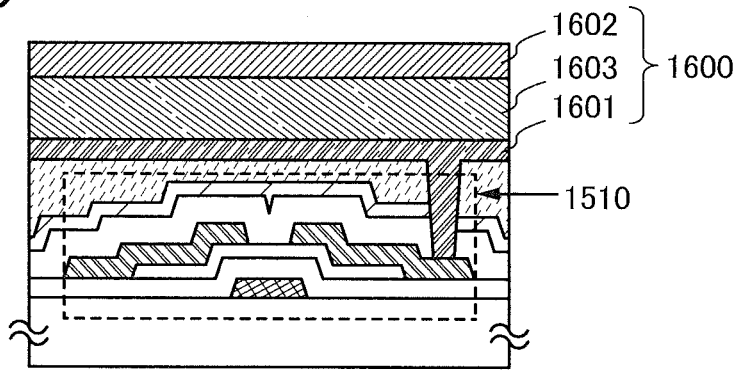

Note that one surface of the substrate 505 in FIG. 3C is deformed in a depressed state because the surface is cut by SSDP-SIMS.

<Sixth Step: Selection of Conductive Material>

Next, as a result of the above SIMS, a conductive material whose concentration of the deuterium atoms contained in the oxide semiconductor layer 531 is higher than or equal to $5 \times 10^{15}$ atoms/cm$^3$ and lower than or equal to $1 \times 10^{17}$ atoms/cm$^3$ is selected. Alternatively, such a conductive material may be selected that the concentration of the deuterium atoms contained in the oxide semiconductor layer 531 in the sample in which the conductive film 502 is formed is substantially equal to the concentration of the deuterium atoms contained in the oxide semiconductor layer 531 in the comparative sample in which the conductive film 502 is not formed.

\<Seventh Step: Application of Conductive Film Including Selected Conductive Material to Second Electrode\>

By performing the first step of this embodiment, an enhancement transistor 1510 including an oxide semiconductor in a channel formation region is formed over an insulating surface of a substrate 1505 and then by performing the second step, a first electrode 1601 electrically connected to one of a source electrode layer and a drain electrode layer of the enhancement transistor 1510 is formed. After that, an organic layer 1603 containing a light-emitting substance is formed over the first electrode 1601, and a second electrode 1602 is formed in contact with the organic layer 1603 containing a light-emitting substance. Here, as the second electrode, the inert conductive material selected in the sixth step is applied (see FIG. 3D).

According to the method for designing a semiconductor device described in this embodiment, the deuterated water with which the first electrode 601 for design is coated in the third step does not reach the oxide semiconductor layer 531 because the insulating layer 516 (the protective insulating layer 506 in the case where the protective insulating layer 506 is formed) and the second insulating layer 517 which are included in the transistor 510 for design hinder penetration of the deuterated water. However, when the conductive film 502 containing an active metal is formed over the first electrode 601 for design, the deuterated water adsorbed on the surface of the first electrode 601 for design is reduced and a deuterium ion or a deuterium molecule is generated. The generated deuterium ion or deuterium molecule is diffused into the insulating layer 516 (the protective insulating layer 506 in the case where the protective insulating layer 506 is formed) and the second insulating layer 517 and reaches the oxide semiconductor layer 531.

Therefore, according to the this embodiment in which deuterated water containing deuterium atoms at a concentration higher than the concentration of deuterium atoms distributed naturally is used, from the observation of deuterium at a concentration exceeding $1 \times 10^{17}$ atoms/cm$^3$ in the oxide semiconductor layer 531, the deuterated water adsorbed on the first electrode 601 for design is decomposed by the conductive film 502, that is, the conductive film 502 is active in terms of reduction of water; accordingly, the reduction capability of the conductive film 502 can be evaluated. With the method exemplified in this embodiment, a method for designing a highly reliable semiconductor device including an oxide semiconductor, in which an inert conductive material that reacts with water to a degree that does not easily allows generation of a hydrogen ion or a hydrogen molecule can be selected and generation of a hydrogen ion or a hydrogen molecule that increases the carrier concentration of the oxide semiconductor is suppressed, can be provided. Further, a method for designing a highly reliable light-emitting device including an oxide semiconductor can be provided.

In addition, since the transistor exemplified in this embodiment has high field-effect mobility, high-speed operation is possible. Thus, when the transistor including an oxide semiconductor layer is used in a pixel portion of a display device, a high-quality image can be provided. In addition, by using the transistors including an oxide semiconductor layer, a driver circuit portion and a pixel portion are formed over one substrate; thus, the number of components of the display device can be reduced.

This embodiment can be combined with any of the other embodiments in this specification as appropriate.

Embodiment 3

In this embodiment, a structure of a light-emitting element in which an inert conductive material that reacts with deuterated water to a degree that does not easily allows generation of a deuterium ion or a deuterium molecule can be applied to a second electrode regardless of its work function will be described. Specifically, a structure of a light-emitting element in which an organic layer containing a light-emitting substance is provided between a first electrode which can be electrically connected to a source electrode layer or a drain electrode layer of an enhancement transistor including an oxide semiconductor in a channel formation region, and a second electrode; and a method for manufacturing the light-emitting element will be described with reference to FIG. 4.

Note that the structure of a light-emitting element exemplified in this embodiment can include a first electrode as an anode and a second electrode as a cathode. Alternatively, the first electrode can serve as a cathode and the second electrode can serve as an anode. Note that as an EL layer provided between the first electrode and the second electrode, a structure may be selected as appropriate in accordance with polarities and materials of the first electrode and the second electrode.

Figure 4:
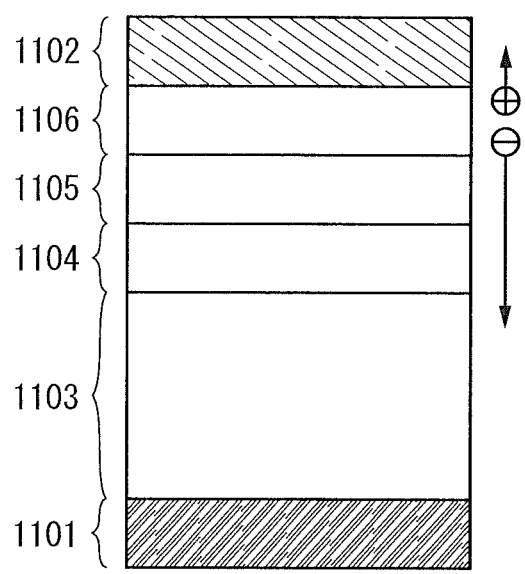
FIG. 4 is a diagram illustrating a structure of a light-emitting element applied to a semiconductor device according to an embodiment.

FIG. 4 illustrates an example of a structure of a light-emitting element which can be used in a light-emitting device exemplified in this embodiment. In the light-emitting element illustrated in FIG. 4, an organic layer 1103 containing a light-emitting substance is interposed between electrodes of an anode 1101 and a cathode 1102. A first charge generation region 1106, an electron-relay layer 1105, and an electron-injection buffer 1104 are sequentially stacked from the cathode 1102 side between the cathode 1102 and the organic layer 1103 containing a light-emitting substance.

In the first charge generation region 1106, holes and electrons are generated, and the holes move into the cathode 1102 and the electrons move into the electron-relay layer 1105. The electron-relay layer 1105 has a high electron-transport property and immediately transfers the electrons generated in the first charge generation region 1106 to the electron-injection buffer 1104. Further, the electron-injection buffer 1104 can reduce a barrier in injection of electrons into the organic layer 1103 containing a light-emitting substance, and the efficiency of the electron injection into the organic layer 1103 containing a light-emitting substance can be improved. Thus, the electrons generated in the first charge generation region 1106 are injected into the LUMO level of the organic layer 1103 containing a light-emitting substance through the electron-relay layer 1105 and the electron-injection buffer 1104.

Note that the LUMO level of the substance used for the electron-relay layer 1105 is farmed so as to be a level between the acceptor level of an acceptor substance in the first charge generation region 1106 and the LUMO level of the organic layer 1103 containing a light-emitting substance. Specifically, it is preferable that the LUMO level of the electron-relay layer 1105 be approximately greater than or equal to $-5.0$ eV and less than or equal to $-3.0$ eV. In addition, the electron-relay layer 1105 can prevent interaction in which the substance included in the first charge generation region 1106 and the substance included in the electron-injection buffer 1104 react with each other at the interface thereof and the functions of the first charge generation region 1106 and the electron-injection buffer 1104 are damaged.

Next, materials that can be used for the above-described light-emitting element are specifically described.

\<Structure of Anode\>

The anode 1101 is preferably formed using a metal, an alloy, an electrically conductive compound, a mixture of these materials, or the like which has a high work function (specifically, a work function of higher than or equal to 4.0 eV is more preferable). Specifically, for example, indium tin oxide (ITO), indium tin oxide containing silicon or silicon oxide, indium zinc oxide (IZO), and indium oxide containing tungsten oxide and zinc oxide can be given.

Films of these conductive metal oxide films are usually formed by sputtering; however, a sol-gel method or the like may also be used. For example, a film of indium zinc oxide (IZO) can be formed by a sputtering method using a target in which zinc oxide is added to indium oxide at 1 wt % to 20 wt %. A film of indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively.

Besides, for example, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, and titanium oxide. Alternatively, a conductive polymer such as poly(3,4-ethylenedioxythiophene)/poly(styrenesulfonic acid) (PEDOT/PSS) or polyaniline/poly(styrenesulfonic acid) (PAni/PSS) may be used.

Note that in the case where a second charge generation region is provided in contact with the anode 1101, a variety of conductive materials can be used for the anode 1101 regardless of their work functions. Specifically, besides a material which has a high work function, a material which has a low work function can also be used for the anode 1101. A material for forming the second charge generation region will be subsequently described together with a material for forming the first charge generation region.

<Structure of Cathode>

In the case where the first charge generation region 1106 is provided in contact with the cathode 1102 between the cathode 1102 and the organic layer 1103 containing a light-emitting substance, a variety of conductive materials can be used for the cathode 1102 regardless of their work functions.

Note that at least one of the cathode 1102 and the anode 1101 may be formed using a conductive film which transmits visible light. For the conductive film which transmits visible light, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, and indium tin oxide to which silicon oxide is added can be given. Further, a metal thin film having a thickness enough to transmit light (preferably, approximately 5 nm to 30 nm) can also be used.

<Structure of Organic Layer containing Light-Emitting Substance>

The organic layer 1103 containing a light-emitting substance includes at least a light-emitting layer, and may have a stacked-layer structure in which a layer/layers other than the light-emitting layer is/are stacked on the light-emitting layer. As the layers other than the light-emitting layer, for example, there are layers formed of a material having a high hole-injection property, a material having a high hole-transport property, a material having a high electron-transport property, a material having a high electron-injection property, a material having a bipolar property (a material having high electron-and-hole-transport properties), and the like. Specifically, a hole-injection layer, a hole-transport layer, a light-emitting layer, a hole-blocking layer, an electron-transport layer, an electron-injection layer, and the like are given, and they can be combined as appropriate and stacked from the anode side.

Specific examples of the materials for the layers included in the above organic layer 1103 containing a light-emitting substance are described below.

The hole-injection layer is a layer containing a substance having a high hole-injection property. As the substance having a high hole-injection property, for example, molybdenum oxide, vanadium oxide, ruthenium oxide, tungsten oxide, manganese oxide, or the like can be used. Besides, it is possible to use a phthalocyanine-based compound such as phthalocyanine ($H_2Pc$) or copper phthalocyanine (CuPc), a high molecule such as poly(3,4-ethylenedioxythiophene)/poly(styrenesulfonic acid) (PEDOT/PSS), or the like to form the hole-injection layer.

Note that the hole-injection layer may be formed using the second charge generation region. When the second charge generation region is used for the hole-injection layer, a variety of conductive materials can be used for the anode 1101 regardless of their work functions as described above. A material for forming the second charge generation region will be subsequently described together with a material for forming the first charge generation region.

The hole-transport layer is a layer containing a substance having a high hole-transport property. As the substance having a high hole-transport property, the following can be given, for example: aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4-phenyl-4'-(9-phenylfluoren-9-yl)triphenylamine (abbreviation: BPAFLP)], 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like. Alternatively, any of the following carbazole derivatives can be used: 4,4'-di(N-carbazolyl)biphenyl (abbreviation: CBP); 1,3,5-tris[4-(N-carbazolyl)phenyl]benzene (abbreviation: TCPB); and 9-[4-(10-phenyl-9-anthracenyl)phenyl]-9H-carbazole (abbreviation: CzPA). The substances mentioned here are mainly ones that have a hole mobility of higher than or equal to $10^{-6}$ $cm^2/Vs$. However, any substance other than the above substances may also be used as long as it is a substance in which the hole-transport property is higher than the electron-transport property. The layer containing a substance having a high hole-transport property is not limited to a single layer, and two or more layers containing the aforementioned substances may be stacked.

In addition to the above substances, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can be used for the hole-transport layer.

The light-emitting layer is a layer containing a light-emitting substance. As the light-emitting substance, any of the following fluorescent compounds can be used. As the light-emitting substance, the following fluorescent compound can be given, for example: N,N'-bis[4-(9H-carbazol-9-yl)phenyl]-N,N'-diphenylstilbene-4,4'-diamine (abbreviation:

YGA2S); 4-(9H-carbazol-9-yl)-4'-(10-phenyl-9-anthryl)triphenylamine (abbreviation: YGAPA); 4-(9H-carbazol-9-yl)-4'-(9,10-diphenyl-2-anthryl)triphenylamine (abbreviation: 2YGAPPA); N,9-diphenyl-N-[4-(10-phenyl-9-anthryl)phenyl]-9H-carbazol-3-amine (abbreviation: PCAPA); perylene; 2,5,8,11-tetra-tert-butylperylene (abbreviation: TBP); 4-(10-phenyl-9-anthryl)-4'-(9-phenyl-9H-carbazol-3-yl)triphenylamine (abbreviation: PCBAPA); N,N'''-(2-tert-butylanthracene-9,10-diyldi-4,1-phenylene)bis[N,N',N'-triphenyl-1,4-phenylenediamine] (abbreviation: DPABPA); N,9-diphenyl-N-[4-(9,10-diphenyl-2-anthryl)phenyl]-9H-carbazol-3-amine (abbreviation: 2PCAPPA); N-[4-(9,10-diphenyl-2-anthryl)phenyl]-N,N',N'-triphenyl-1,4-phenylenediamine (abbreviation: 2DPAPPA); N,N,N',N',N'',N'',N''',N'''-octaphenyldibenzo[g,p]chrysene-2,7,10,15-tetraamine (abbreviation: DBC1); coumarin 30; N-9,10-diphenyl-2-anthryl)-N,9-diphenyl-9H-carbazol-3-amine (abbreviation: 2PCAPA); N-[9,10-bis(1,1'-biphenyl-2-yl)-2-anthryl]-N,9-diphenyl-9H-carbazol-3-amine (abbreviation: 2PCABPhA); N-(9,10-diphenyl-2-anthryl)-N,N',N'-triphenyl-1,4-phenylenediamine (abbreviation: 2DPAPA); N-[9,10-bis(1,1'-biphenyl-2-yl)-2-anthryl]-N,N',N'-triphenyl-1,4-phenylenediamine (abbreviation: 2DPABPhA); 9,10-bis(1,1'-biphenyl-2-yl)-N-[4-(9H-carbazol-9-yl)phenyl]-N-phenylanthracen-2-amine (abbreviation: 2YGABPhA); N,N,9-triphenylanthracen-9-amine (abbreviation: DPhAPhA); coumarin 545T; N,N'-diphenylquinacridone (abbreviation: DPQd); rubrene; 5,12-bis(1,1'-biphenyl-4-yl)-6,11-diphenyltetracene (abbreviation: BPT); 2-(2-{2-[4-(dimethylamino)phenyl]ethenyl}-6-methyl-4H-pyran-4-ylidene)propanedinitrile (abbreviation: DCM1); 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2); N,N,N',N'-tetrakis(4-methylphenyl)tetracene-5,11-diamine (abbreviation: p-mPhTD); 7,14-diphenyl-N,N,N',N'-tetrakis(4-methylphenyl)acenaphtho[1,2-a]fluoranthene-3,10-diamine (abbreviation: p-mPhAFD); 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI); 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB); 2-(2,6-bis{2-[4-(dimethylamino)phenyl]ethenyl}-4H-pyran-4-ylidene)propanedinitrile (abbreviation: BisDCM); 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM); and SD1 (product name; manufactured by SFC Co., Ltd).

As the light-emitting substance, any of the following phosphorescent compounds can also be used. The following can be given, for example: bis[2-(4',6'-difluorophenyl)pyridinato-N,C$^{2'}$]iridium(III) tetrakis(1-pyrazolyl)borate (abbreviation: FIr6); bis[2-(4',6'-difluorophenyl)pyridinato-N,C$^{2'}$]iridium(III)picolinate (abbreviation: FIrpic); bis[2-(3',5'-bistrifluoromethylphenyl)pyridinato-N,C$^{2'}$]iridium(III) picolinate (abbreviation: Ir(CF$_3$ppy)$_2$(pic)); bis[2-(4',6'-difluorophenyl)pyridinato-N,C$^{2'}$]iridium(III)acetylacetonate (abbreviation: FIracac); tris(2-phenylpyridinato)iridium(III) (abbreviation: Ir(ppy)$_3$); bis(2-phenylpyridinato)iridium(III) acetylacetonato (abbreviation: Ir(ppy)$_2$(acac)); bis(benzo[h]quinolinato)iridium(III)acetylacetonate (abbreviation: Ir(bzq)$_2$(acac)); bis(2,4-diphenyl-1,3-oxazolato-N,C$^{2'}$)iridium(III)acetylacetonate (abbreviation: Ir(dpo)$_2$(acac)); bis[2-(4'-perfluorophenylphenyl)pyridinato]iridium(III)acetylacetonate (abbreviation: Ir(p-PF-ph)$_2$(acac)); bis(2-phenylbenzothiazolato-N,C$^{2'}$)iridium(III)acetylacetonate (abbreviation: Ir(bt)$_2$(acac)); bis[2-(2'-benzo[4,5-α]thienyl)pyridinato-N,C$^{3'}$]iridium(III) acetylacetonate (abbreviation: Ir(btp)$_2$(acac)); bis(1-phenylisoquinolinato-N,C$^{2'}$)iridium(III)acetylacetonate (abbreviation: Ir(piq)$_2$(acac)); (acetylacetonato)bis[2,3-bis(4-fluorophenyl)quinoxalinato]iridium(III) (abbreviation: Ir(Fdpq)$_2$(acac)); (acetylacetonato)bis(2,3,5-triphenylpyrazinato)iridium(III) (abbreviation: Ir(tppr)$_2$(acac)); 2,3,7,8,12,13,17,18-octaethyl-21H,23H-porphyrin platinum(II) (abbreviation: PtOEP); tris(acetylacetonato)(monophenanthroline)terbium(III) (abbreviation: Tb(acac)$_3$(Phen)); tris(1,3-diphenyl-1,3-propanedionato)(monophenanthroline)europium(III) (abbreviation: Eu(DBM)$_3$(Phen)); tris[1-(2-thenoyl)-3,3,3-trifluoroacetonato](monophenanthroline)europium(III) (abbreviation: Eu(TTA)$_3$(Phen)); and (dipivaloylmethanato)bis(2,3,5-triphenylpyrazinato)iridium(III) (abbreviation: Ir(tppr)$_2$(dpm)).

Note that those light-emitting substances are preferably dispersed in a host material. As the host material, for example, the following can be used: an aromatic amine compound such as NPB (abbreviation), TPD (abbreviation), TCTA (abbreviation), TDATA (abbreviation), MTDATA (abbreviation), or BSPB (abbreviation); a carbazole derivative such as PCzPCA1 (abbreviation), PCzPCA2 (abbreviation), PCzPCN1 (abbreviation), CBP (abbreviation), TCPB (abbreviation), CzPA (abbreviation), 9-phenyl-3-[4-(10-phenyl-9-anthryl)phenyl]-9H-carbazole (abbreviation: PCzPA), or 4-phenyl-4'-(9-phenyl-9H-carbazol-3-yl)triphenylamine (abbreviation: PCBA1BP); a substance having a high hole-transport property which contains a high molecular compound, such as PVK (abbreviation), PVTPA (abbreviation), PTPDMA (abbreviation), or Poly-TPD (abbreviation); a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq); a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$); or a substance having a high electron-transport property, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-butylphenyl)-1,2,4-triazole (abbreviation: TAZ), bathophenanthroline (abbreviation: BPhen), or bathocuproine (abbreviation: BCP).

The electron-transport layer is a layer containing a substance having a high electron-transport property. As the substance having a high electron-transport property, for example, a metal complex having a quinoline skeleton or a benzoquinoline skeleton, such as Alq (abbreviation), Almq$_3$ (abbreviation), BeBq$_2$ (abbreviation), or BAlq (abbreviation) can be used. In addition to the above, a metal complex having an oxazole-based or thiazole-based ligand, such as Zn(BOX)$_2$ (abbreviation) or Zn(BTZ)$_2$ (abbreviation) can also be used, for example. Further, besides the metal complex, PBD (abbreviation), OXD-7 (abbreviation), CO11 (abbreviation), TAZ (abbreviation), BPhen (abbreviation), BCP (abbreviation), 2-[4-(dibenzothiophen-4-yl)phenyl]-1-phenyl-1H-benzimidazole (abbreviation: DBTBIm-II), or the like can also be used. The substances mentioned here are mainly ones that have an electron mobility of higher than or equal to $10^{-6}$ cm$^2$/Vs. Note that any substance other than the above substances may also be used as long as it is a substance in which the electron-transport property is higher than the hole-transport property. Furthermore, the electron-transport layer may have a structure in which two or more layers formed of the above substances are stacked, without limitation to a single-layer structure.

Alternatively, a high molecular compound can be used. For example, poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can be used.

The electron-injection layer is a layer containing a substance having a high electron-injection property. As the substance having a high electron-injection property, the following can be given: an alkali metal or an alkaline earth metal such as lithium (Li), cesium (Cs), calcium (Ca), lithium fluoride (LiF), cesium fluoride (CsF), and calcium fluoride ($CaF_2$), and a compound thereof. Alternatively, a layer containing a substance having an electron-transport property and an alkali metal, an alkaline earth metal, or a compound thereof (e.g., Alq containing magnesium (Mg)) can be used. Such a structure increases the efficiency in electron injection from the cathode 1102.

With the stack of these layers in an appropriate combination, the organic layer 1103 containing a light-emitting substance can be formed. Further, as a formation method of the organic layer 1103 containing a light-emitting substance, any of a variety of methods (e.g., a dry process and a wet process) can be selected as appropriate depending on a material to be used. For example, a vacuum evaporation method, an ink-jet method, a spin coating method, or the like can be used. Note that a different formation method may be employed for each layer.

Further, between the cathode 1102 and the organic layer 1103 containing a light-emitting substance, the electron-injection buffer 1104, the electron-relay layer 1105, and the first charge generation region 1106 are provided. The first charge generation region 1106 is formed in contact with the cathode 1102, the electron-relay layer 1105 is formed in contact with the first charge generation region 1106, and the electron-injection buffer 1104 is formed in contact with and between the electron-relay layer 1105 and the organic layer 1103 containing a light-emitting substance.

<Structure of Charge Generation Region>

The first charge generation region 1106 and the second charge generation region are regions containing a substance having a high hole-transport property and an acceptor substance. The charge generation regions may not only include a substance having a high hole-transport property and an acceptor substance in the same film but also includes a stacked layer of a layer containing a substance having a high hole-transport property and a layer containing an acceptor substance. Note that when the first charge generation region has a stacked-layer structure on the cathode side, the layer containing the substance having a high hole-transport property is in contact with the cathode 1102, and when the second charge generation region has a stacked-layer structure provided on the anode side, the layer containing the acceptor substance is in contact with the anode 1101.

Note that the acceptor substance is preferably added to the charge generation region so that the mass ratio of the acceptor substance to the substance having a high hole-transport property is from 0.1:1 to 4.0:1.

As the acceptor substance that is used for the charge generation region, a transition metal oxide and an oxide of a metal belonging to Groups 4 to 8 of the periodic table can be given. Specifically, molybdenum oxide is particularly preferable. Note that molybdenum oxide has a low hygroscopic property.

As the substance having a high hole-transport property used for the charge generation region, any of a variety of organic compounds such as an aromatic amine compound, a carbazole derivative, an aromatic hydrocarbon, and a high molecular compound (e.g., an oligomer, a dendrimer, or a polymer) can be used. Specifically, a substance having a hole mobility of higher than or equal to $10^{-6}$ $cm^2$/Vs is preferably used. However, any substance other than the above substances may also be used as long as it is a substance in which the hole-transport property is higher than the electron-transport property.

<Structure of Electron-Relay Layer>

The electron-relay layer 1105 is a layer that can immediately receive electrons drawn out by the acceptor substance in the first charge generation region 1106. Therefore, the electron-relay layer 1105 is a layer containing a substance having a high electron-transport property and is formed to have a LUMO level between the acceptor level of the acceptor in the first charge generation region 1106 and the LUMO level of the organic layer 1103 containing a light-emitting substance. Specifically, it is preferable that the LUMO level of the electron-relay layer 1105 be approximately greater than or equal to −5.0 eV and less than or equal to −3.0 eV. As the substance used for the electron-relay layer 1105, for example, a perylene derivative and a nitrogen-containing condensed aromatic compound can be given. Note that a nitrogen-containing condensed aromatic compound is preferably used for the electron-relay layer 1105 because of its stability. Among nitrogen-containing condensed aromatic compounds, a compound having an electron-withdrawing group, such as a cyano group or a fluoro group, is preferably used because such a compound further facilitates reception of electrons in the electron-relay layer 1105.

As specific examples of the perylene derivative, the following can be given: 3,4,9,10-perylenetetracarboxylic dianhydride (abbreviation: PTCDA); 3,4,9,10-perylenetetracarboxylic bisbenzimidazole (abbreviation: PTCBI); N,N'-dioctyl-3,4,9,10-perylenetetracarboxylic diimide (abbreviation: PTCDI-C8H); and N,N'-dihexyl-3,4,9,10-perylenetetracarboxylic diimide (abbreviation: Hex PTC).

As specific examples of the nitrogen-containing condensed aromatic compound, the following can be given: pirazino[2,3-f][1,10]phenanthroline-2,3-dicarbonitrile (abbreviation: PPDN); 2,3,6,7,10,11-hexacyano-1,4,5,8,9,12-hexaazatriphenylene (abbreviation: $HAT(CN)_6$); 2,3-diphenylpyrido[2,3-b]pyrazine (abbreviation: 2PYPR); and 2,3-bis(4-fluorophenyl)pyrido[2,3-b]pyrazine (abbreviation: F2PYPR).

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluoro phthalocyanine (abbreviation: $F_{16}CuPc$), N,N'-bis(2,2,3,3,4,4,5,5,6,6,7,7,8,8-pentadecafluorooctyl-1,4,5,8-naphthalenetetracarboxylic diimide (abbreviation: NTCDI-C8F), 3',4'-dibutyl-5,5"-bis(dicyanomethylene)-5,5"-dihydro-2,2':5',2"-terthiophen (abbreviation: DCMT), methanofullerene such as [6,6]-phenyl $C_{61}$ butyric acid methyl ester, or the like can be used for the electron-relay layer 1105.

<Structure of Electron-Injection Buffer>

The electron-injection buffer 1104 is a layer which facilitates injection of electrons from the first charge generation region 1106 to the organic layer 1103 containing a light-emitting substance. The provision of the electron-injection buffer 1104 between the first charge generation region 1106 and the organic layer 1103 containing a light-emitting substance makes it possible to reduce the injection barrier between the first charge generation region 1106 and the organic layer 1103 containing a light-emitting substance.

A substance having a high electron-injection property can be used for the electron-injection buffer 1104: for example, an alkali metal, an alkaline earth metal, a rare earth metal, a compound of the above metal (e.g., an alkali metal compound (including an oxide such as lithium oxide, a halide, or carbonate such as lithium carbonate or cesium carbonate), an alkaline earth metal compound (including an oxide, a halide, or carbonate), or a rare earth metal compound (including an oxide, a halide, or carbonate)).

Further, in the case where the electron-injection buffer 1104 contains a substance having a high electron-transport property and a donor substance, the donor substance is preferably added to the substance having a high electron-transport property so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide of lithium oxide, a halide, or carbonate such as lithium carbonate or cesium carbonate), an alkaline earth metal compound (including an oxide, a halide, or carbonate), or a rare earth metal compound (including an oxide, a halide, or carbonate)). Note that as the substance having a high electron-transport property, a material similar to the above-described material for the electron-transport layer which can be formed in part of the organic layer 1103 containing a light-emitting substance can be used.

The light-emitting element described in this embodiment can be manufactured by combination of the above-described materials. Light emission from the above-described light-emitting substance can be obtained with this light-emitting element, and the emission color can be selected by changing the type of the light-emitting substance. Further, a plurality of light-emitting substances which emit light of different colors can be used, whereby, for example, white light emission can also be obtained by expanding the width of the emission spectrum. Note that in order to obtain white light emission, light-emitting substances which emit light whose colors are complementary may be used, for example, different layers which emit light whose colors are complementary or the like can be used. Specific examples of complementary colors include "blue and yellow", "blue-green and red", and the like.

The light-emitting element exemplified in this embodiment can be formed in such a manner that an enhancement transistor including an oxide semiconductor in a channel formation region is formed over an insulating surface of a substrate, with the use of a first electrode electrically connected to a source electrode layer or a drain electrode layer of the transistor, and a second electrode including an inert conductive material that reacts with water to a degree that does not easily allows generation of a hydrogen ion or a hydrogen molecule, which is selected by the method exemplified in Embodiment 1 or Embodiment 2.

Further, the light-emitting element described in this embodiment can be formed by any of a variety of methods regardless of whether it is a dry process (e.g., a vacuum evaporation method) or a wet process (e.g., an ink-jet method or a spin coating method).

With application of the structure of the light-emitting element exemplified in this embodiment, the inert conductive material that reacts with deuterated water to a degree that does not easily allows generation of a deuterium ion or a deuterium molecule can be applied to the second electrode regardless of its work function. Further, when the first electrode of the light-emitting element exemplified in this embodiment is electrically connected to the source electrode layer or the drain electrode layer of the enhancement transistor including an oxide semiconductor in the channel formation region, a highly reliable light-emitting device including an oxide semiconductor can be designed.

This embodiment can be combined with any of the other embodiments in this specification as appropriate.

Embodiment 4

In this embodiment, a structure of a light-emitting display device provided with a light-emitting element in which an inert conductive material that reacts with deuterated water to a degree that does not easily allows generation of a deuterium ion or a deuterium molecule is applied to a second electrode will be described. Specifically, a light-emitting display device provided with a light-emitting element utilizing electroluminescence, which includes a layer containing a light-emitting substance between a first electrode electrically connected to a source electrode layer or a drain electrode layer of an enhancement inverted staggered transistor including an oxide semiconductor in a channel formation region and a second electrode to which an inert conductive material that reacts with deuterated water to a degree that does not easily allows generation of a deuterium ion or a deuterium molecule is applied. Note that light-emitting elements utilizing electroluminescence are classified by whether a light-emitting material is an organic compound or an inorganic compound. In general, the tinnier is called an organic EL element, and the latter is called an inorganic EL element.

An organic EL element includes an organic layer containing a light-emitting substance between a pair of electrodes. When a voltage is applied between the pair of electrodes, electrons are injected from one of the electrodes and holes are injected from the other of the electrodes into the organic layer containing a light-emitting substance, so that a current flows therethrough. Then, by recombination of these carriers (electrons and holes), the light-emitting substance forms an excited state, and emits light when the excited state returns to a ground state. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Although the case where an organic EL element is used as a light-emitting element will be described in this embodiment, an inorganic EL element can also be used as a light-emitting element.

<Configuration of Pixel>

Figure 5:
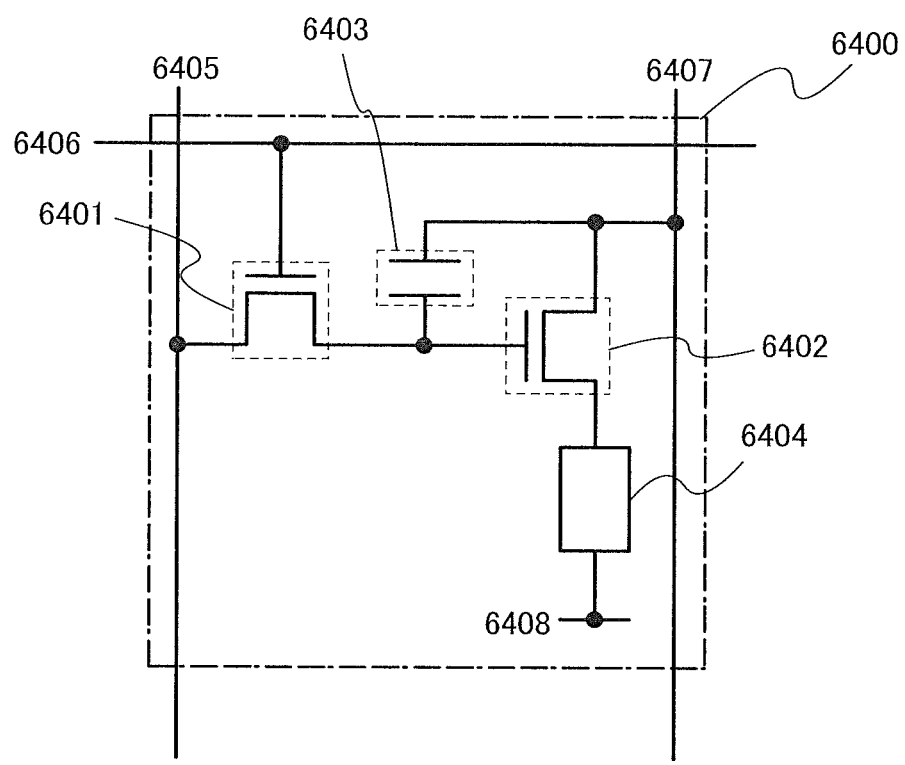
FIG. 5 is an equivalent circuit diagram illustrating a configuration of a pixel according to an embodiment.

FIG. 5 is an equivalent circuit diagram illustrating a configuration of a pixel included in a light-emitting display device which will be exemplified in this embodiment. Note that as for the pixel, either digital time gray scale driving or analog gray scale driving can be applied.

The pixel exemplified in this embodiment includes two n-channel transistors each of which includes an oxide semiconductor layer in a channel formation region. A pixel 6400 includes a switching transistor 6401, a transistor 6402 for driving a light-emitting element, a light-emitting element 6404, and a capacitor 6403. A gate of the switching transistor 6401 is connected to a scan line 6406, a first electrode (one of a source electrode layer and a drain electrode layer) of the switching transistor 6401 is connected to a signal line 6405, and a second electrode (the other of the source electrode layer and the drain electrode layer) of the switching transistor 6401 is connected to a gate of the transistor 6402 for driving the light-emitting element. The gate of the transistor 6402 for driving the light-emitting element is connected to a power supply line 6407 through the capacitor 6403, a first electrode of the transistor 6402 for driving the light-emitting element is connected to the power supply line 6407, and a second electrode of the transistor 6402 for driving the light-emitting element is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (the common electrode 6408) of the light-emitting element 6404 is set to a low power source potential. Note that the low power source potential is a potential in which the low power source potential is smaller than a high power source potential which is set to the power supply line 6407. As the low power source potential, GND or 0 V may be employed, for example. The high power source potential and the low power source potential are set so that the voltage difference therebetween becomes greater than or equal to the emission start voltage of the light-emitting element 6404, and the potential difference is applied to the light-emitting element 6404. Accordingly, a current is made to flow and light is emitted. Note that the common electrode 6408 may be set to a high power source potential, and the power supply line 6407 may be set to a low power source potential. In that case, the structure of the light-emitting element 6404 may be modified as appropriate because the current in the light-emitting element 6404 flows reversely.

When the gate capacitance of the transistor 6402 for driving the light-emitting element is used as a substitute for the capacitor 6403, the capacitor 6403 can be omitted. The gate capacitance of the transistor 6402 for driving the light-emitting element may be formed between a channel region and a gate electrode. Even when a transistor having a reduced off-state current is applied to the switching transistor 6401, the capacitor 6403 can be omitted. As the transistor having a reduced off-state current, a transistor including an oxide semiconductor layer in a channel formation region can be given as an example.

An operation in the case where digital time gray scale driving is applied to the pixel illustrated in the equivalent circuit diagram of FIG. 5 will be described. In the case where a voltage-input voltage driving method is employed, a video signal is input to the gate of the transistor 6402 for driving the light-emitting element so that the transistor 6402 for driving the light-emitting element is in either of two states of being sufficiently turned on and turned off. That is, the transistor 6402 for driving the light-emitting element is made to operate in a linear region. Since the transistor 6402 for driving the light-emitting element is made to operate in a linear region, a voltage higher than the voltage of the power supply line 6407 is applied to the gate of the transistor 6402 for driving the light-emitting element. Note that a voltage higher than or equal to the following is applied to the signal line 6405: a power supply line voltage plus a threshold voltage $V_{th}$ of the transistor 6402 for driving the light-emitting element.

Further, analog gray scale driving can be applied to the pixel illustrated in the equivalent circuit diagram of FIG. 5 by inputting signals in a different way, instead of the digital time gray scale driving.

In the case where the analog gray scale driving is applied to the pixel illustrated in the equivalent circuit diagram of FIG. 5, a voltage higher than or equal to the following is applied to the gate of the transistor 6402 for driving the light-emitting element: forward voltage of the light-emitting element 6404 + $V_{th}$ of the transistor 6402 for driving the light-emitting element. The forward voltage of the light-emitting element 6404 indicates a voltage at which a desired luminance is obtained, and exceeds at least the emission start voltage of the light-emitting element 6404. By inputting a video signal to enable the transistor 6402 for driving the light-emitting element to operate in a saturation region, a current can be supplied to the light-emitting element 6404. Since the transistor 6402 for driving the light-emitting element operates in a saturation region, the potential of the power supply line 6407 is higher than a gate potential of the transistor 6402 for driving the light-emitting element. When an analog video signal is used, it is possible to supply a current to the light-emitting element 6404 in accordance with the video signal and perform analog gray scale driving.

Note that the pixel configuration is not limited to that illustrated in FIG. 5. For example, a switch, a resistor, a capacitor, a transistor, a logic circuit, or the like may be added to the pixel illustrated in FIG. 5. Further, a structure may be employed in which a TFT for current control is connected between the transistor for driving the light-emitting element and the light-emitting element.

<Structure of Light-Emitting Element>

Figure 6A:
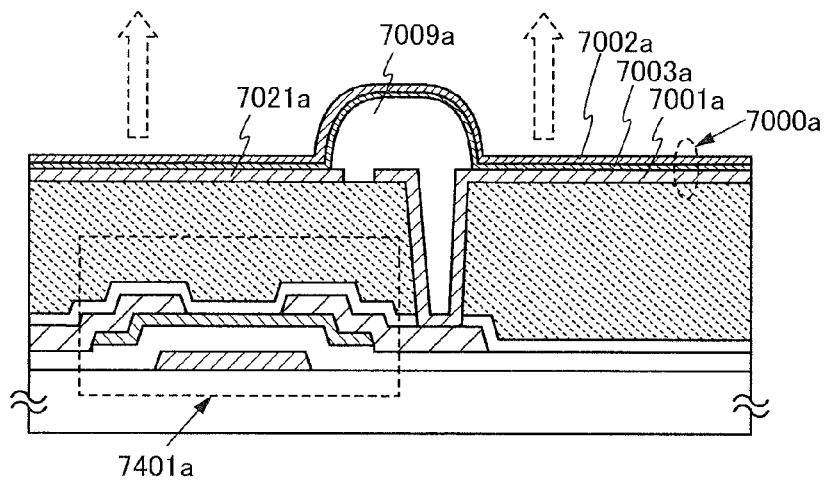
FIGS. 6A to 6C are cross-sectional views each illustrating a structure of a pixel according to an embodiment.
Figure 6B:
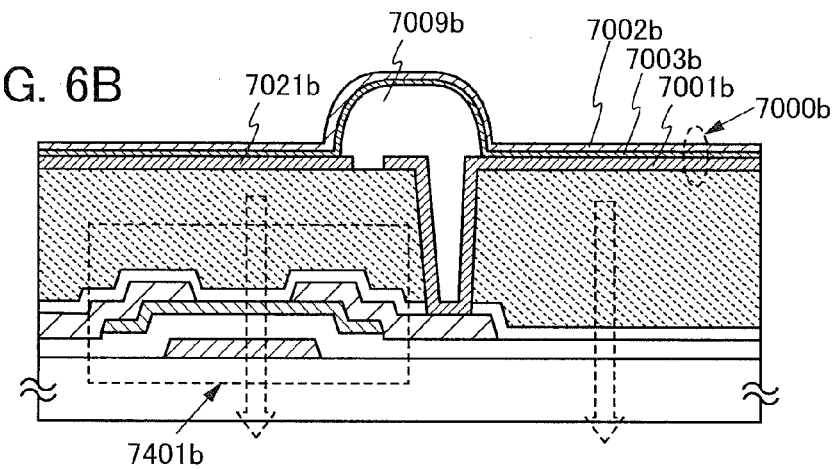
Figure 6C:
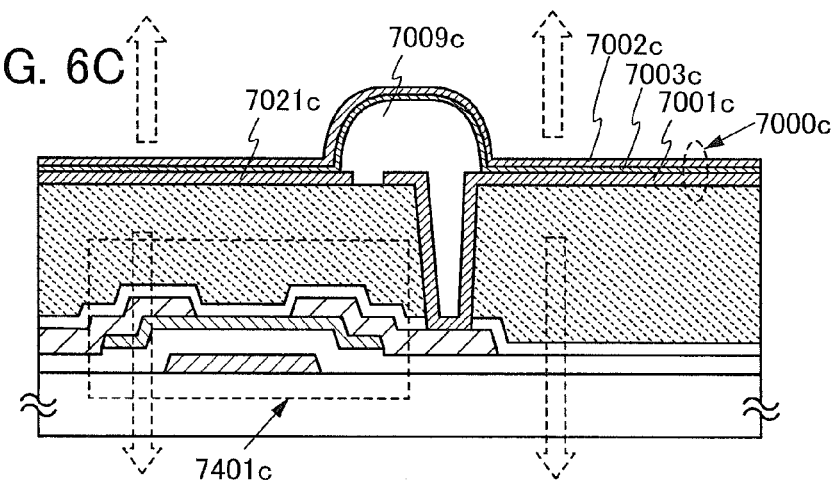

The structure of the light-emitting element will be described with reference to cross-sectional structures of a pixel, which are illustrated in FIGS. 6A to 6C.

At least one of the first electrode and the second electrode of the light-emitting element is formed using a conductive film which transmits visible light, and light emission is extracted from the light-emitting element. As the structure for extracting light emission, the following structures can be given: a top emission structure in which light is emitted from the side where a light-emitting element is formed without through a substrate over which the light-emitting element is fainted; a bottom emission structure in which light is emitted from the side where the light-emitting element is not formed through the substrate over which the light-emitting element is formed; and a dual emission structure in which light is emitted from both the substrate side on which the light-emitting element is formed and the other side of the substrate through the substrate. A light-emitting element having any of these emission structures can be used in combination with the above pixel configuration.

A light-emitting element having a top emission structure is described with reference to FIG. 6A. The light-emitting element having a top emission structure emits light in a direction indicated by arrows in FIG. 6A.

A light-emitting device, the cross-sectional view of which is illustrated as an example in FIG. 6A, includes a transistor 7401a for driving a light-emitting element and a light-emitting element 7000a. The light-emitting element 7000a includes a first electrode 7001a, a second electrode 7002a which transmits visible light, and an organic layer 7003a containing a light-emitting substance provided between the first electrode 7001a and the second electrode 7002a; and the first electrode 7001a is electrically connected to a source electrode layer or a drain electrode layer of the transistor 7401a.

As for the first electrode 7001a, a material which efficiently reflects light emitted from the organic layer 7003a containing a light-emitting substance is preferably used, in which case the light extraction efficiency can be improved. Note that the first electrode 7001a may have a stacked-layer structure. For example, a conductive film which transmits visible light, which is formed on the side which is in contact with the organic layer 7003a containing a light-emitting substance, may be stacked over a light shielding film. As the light shielding film, although a metal film or the like which efficiently reflects light emitted from the organic layer containing a light-emitting substance is preferable, for example, a resin or the like to which a black pigment is added can also be used.

The second electrode 7002a is formed using a conductive film which transmits visible light. For the conductive film which transmits visible light, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, and indium tin oxide to which silicon oxide is added can be given. Further, a metal thin film having a thickness enough to transmit light (preferably, approximately 5 nm to 30 nm) can also be used. For example, an aluminum film having a thickness of 20 nm is used as the second electrode 7002a.

Note that one of the first electrode 7001a and the second electrode 7002a functions as an anode, and the other functions as a cathode. It is preferable to use a substance having a high work function for the electrode which functions as an anode, and a substance having a low work function for the electrode which functions as a cathode.

The organic layer 7003a containing a light-emitting substance may be either a single layer or a stack of plural layers. As the structure in which a plurality of layers is stacked, a structure in which an anode, a hole injection layer, a hole transport layer, a light-emitting layer, an electron transport layer, and an electron injection layer are stacked in this order can be given as an example. Note that unlike the light-emitting layer, not all of these layers except the light-emitting layer are necessarily provided in the organic layer 7003a containing a light-emitting substance. Further, each of these layers may be provided in duplicate or more. Specifically, in the organic layer 7003a containing a light-emitting substance, a plurality of light-emitting layers may be overlapped with each other or another hole injection layer may be overlapped with the electron injection layer. Furthermore, another component such as an electron-relay layer may be added as appropriate as an intermediate layer, in addition to the charge generation layer.

The light-emitting element 7000a is provided with a partition wall 7009a to cover edges of the first electrode 7001a and a first electrode 7021a of an adjacent pixel. As the partition wall 7009a, an inorganic insulating film or an organic polysiloxane film can be applied in addition to an organic resin film of polyimide, acrylic, polyamide, epoxy, or the like. It is particularly preferable that the partition wall 7009a be faulted using a photosensitive resin material so that a side surface of the partition wall 7009a be formed as a tilted surface with a continuous curvature. In the case where a photosensitive resin material is used for the partition wall 7009a, a step of forming a resist mask can be omitted. Further, the partition wall can be formed using an inorganic insulating film. When the inorganic insulating film is used for the partition wall, the amount of moisture contained in the partition wall can be reduced. Even when an inert conductive film is used for the second electrode, it is preferable to reduce the amount of moisture contained in the partition wall so that a possibility that a hydrogen ion or a hydrogen molecule might be generated due to the use over a long period of time is reduced as much as possible.

Next, a light-emitting element having a bottom emission structure is described with reference to FIG. 6B. The light-emitting element having a bottom emission structure emits light in a direction indicated by arrows in FIG. 6B.

A light-emitting device, the cross-sectional view of which is illustrated as an example in FIG. 6B, includes a transistor 7401b for driving a light-emitting element and a light-emitting element 7000b. The light-emitting element 7000b includes a first electrode 7001b which transmits visible light, a second electrode 7002b, and an organic layer 7003b containing a light-emitting substance between the first electrode 7001b and the second electrode 7002b; and the first electrode 7001b is electrically connected to a source electrode layer or a drain electrode layer of the transistor 7401b.

The first electrode 7001b is formed using a conductive film which transmits visible light. The material which can be used for the second electrode 7002a of FIG. 6A can be used for the conductive film which transmits visible light.

As for the second electrode 7002b, a material which efficiently reflects light emitted from the organic layer 7003b containing a light-emitting substance is preferable, and the material which can be used for the first electrode 7001a of FIG. 6A can be used.

Note that one of the first electrode 7001b and the second electrode 7002b functions as an anode, and the other functions as a cathode. It is preferable to use a substance having a high work function for the electrode which functions as an anode, and a substance having a low work function for the electrode which functions as a cathode.

The organic layer 7003b containing a light-emitting substance may be either a single layer or a stack of plural layers. As for the organic layer 7003b containing a light-emitting substance, the structure and material which can be used in FIG. 6A for the organic layer 7003a containing a light-emitting substance can be used.

The light-emitting element 7000b is provided with a partition wall 7009b to cover edges of the first electrode 7001b and a first electrode 7021b of an adjacent pixel. As for the partition wall 7009b, the structure and material which can be used in FIG. 6A for the partition wall 7009a can be used.

Next, a light-emitting element having a dual emission structure is described with reference to FIG. 6C. The light-emitting element having a dual emission structure emits light in a direction indicated by arrows in FIG. 6C.

A light-emitting device, the cross-sectional view of which is illustrated as an example in FIG. 6C, includes a transistor 7401c for driving a light-emitting element and a light-emitting element 7000c. The light-emitting element 7000c includes a first electrode 7001c which transmits visible light, a second electrode 7002c which transmits visible light, and an organic layer 7003c containing a light-emitting substance between the first electrode 7001c and the second electrode 7002c; and the first electrode 7001c is electrically connected to a source electrode layer or a drain electrode layer of the transistor 7401c.

The first electrode 7001c and the second electrode 7002c are each formed using a conductive film which transmits visible light. The material which can be used for the second electrode 7002a of FIG. 6A can be used for the conductive film which transmits visible light.

Note that one of the first electrode 7001c and the second electrode 7002c functions as an anode, and the other functions as a cathode. It is preferable to use a substance having a high work function for the electrode which functions as an anode, and a substance having a low work function for the electrode which functions as a cathode.

The organic layer 7003c containing a light-emitting substance may be either a single layer or a stack of plural layers. As for the organic layer 7003c containing a light-emitting substance, the structure and material which can be used in FIG. 6A for the organic layer 7003a containing a light-emitting substance can be used.

The light-emitting element 7000c is provided with a partition wall 7009c to cover edges of the first electrode 7001c and a first electrode 7021c of an adjacent pixel. As for the partition wall 7009c, the structure and material which can be used in FIG. 6A for the partition wall 7009a can be used.

Note that the structure of the semiconductor device is not limited to those illustrated in FIGS. 6A to 6C and can be modified in various ways based on techniques disclosed in this specification.

<Structure of Light-Emitting Panel>

Next, the appearance and a cross section of a light-emitting display panel (also referred to as a light-emitting panel) utilizing electroluminescence, which is an example of a semiconductor device, will be described with reference to FIGS. 7A and 7B. FIG. 7A is a plan view of a light-emitting panel in which a thin film transistor and a light-emitting element formed over a first substrate are sealed between a first substrate and a second substrate which are attached to each other with a sealant. Note that FIG. 7B corresponds to a cross-sectional view taken along a line H-I of FIG. 7A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b.

The pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that the panel be packaged (sealed) with a protective film (e.g., a laminate film or an ultraviolet curable resin film) or a cover material with high air-tightness and little degasification so that the panel is not exposed to the outside air, in this manner.

In addition, an ultraviolet curable resin or a thermosetting resin can be used for the filler 4507 as well as inert gas such as nitrogen or argon. As examples of the resin which can be used for the filler, polyvinyl chloride (PVC), acrylic, polyimide, an epoxy resin, a silicone resin, polyvinyl butyral (PVB), and ethylene vinyl acetate (EVA) can be given.

The pixel portion 4502, the signal line driver circuits 4503a and 4503b, and the scan line driver circuits 4504a and 4504b formed over the first substrate 4501 each include a plurality of transistors, and a transistor 4510 included in the pixel portion 4502 and a transistor 4509 included in the signal line driver circuit 4503a are illustrated as an example in FIG. 7B.

A back-gate electrode 4540 is provided over part of an insulating layer 4544, which overlaps with a channel formation region of an oxide semiconductor layer in the transistor 4509 for the driver circuit. By providing the back-gate electrode 4540 overlapping with the channel formation region of the oxide semiconductor layer, the amount of variation in threshold voltage of the transistor 4509 before and after the BT test (bias-temperature stress test) can be reduced. A potential of the back-gate electrode 4540 may be the same as or different from that of a gate electrode layer of the transistor 4509. The back-gate electrode 4540 can also function as a second gate electrode layer. Alternatively, the potential of the back-gate electrode 4540 may be GND or 0 V, or the back-gate electrode 4540 may be in a floating state.

Further, the insulating layer 4544 which functions as a planarization insulating film covers the transistors in order to reduce surface unevenness caused by the transistors.

Note that reference numeral 4511 denotes a light-emitting element. A first electrode 4517 which is a pixel electrode included in the light-emitting element 4511 is electrically connected to a source electrode layer or a drain electrode layer of the transistor 4510. The structure of the light-emitting element 4511 includes the first electrode 4517, an organic layer 4512 containing a light-emitting substance, and a second electrode 4513.

A partition wall 4520 is formed using an organic resin film, an inorganic insulating film, or organic polysiloxane. It is particularly preferable that the partition wall 4520 be formed using a photosensitive material so that an opening is formed over the first electrode 4517 and a sidewall of the opening be formed as an inclined surface with a continuous curvature.

The organic layer 4512 containing a light-emitting substance may be formed using either a single layer or a stack of plural layers.

A protective film may be formed over the second electrode 4513 and the partition wall 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, and the pixel portion 4502 from FPCs 4518a and 4518b.

A connection terminal electrode 4515 is formed from the same conductive film as the first electrode 4517 included in the light-emitting element 4511, and a terminal electrode 4516 is formed from the same conductive film as a source electrode layer and a drain electrode layer included in the transistor 4509.

The connection terminal electrode 4515 is electrically connected to a terminal included in the FPC 4518a through an anisotropic conductive film 4519.

In the case where the light-emitting element 4511 has a top emission structure or a dual emission structure, a substrate which transmits visible light is used as the second substrate 4506 which is located in a direction from which light from the light-emitting element 4511 is extracted. For example, a glass plate, a plastic plate, a polyester film, or an acrylic film can be used for the second substrate 4506.

Further, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element 4511. Furthermore, the polarizing plate or the circularly polarizing plate may be provided with an anti-reflection film. For example, anti-glare treatment by which reflected light can be diffused by projections and depressions on the surface so as to reduce the glare can be performed.

Note that as the signal line driver circuits 4503a and 4503b and the scan line driver circuits 4504a and 4504b, driver circuits formed using a single crystal semiconductor film or a polycrystalline semiconductor film over a substrate separately prepared may be used and mounted. Alternatively, only the signal line driver circuits or part thereof, or only the scan line driver circuits or part thereof may be separately formed and mounted. This embodiment is not limited to the structure illustrated in FIGS. 7A and 7B.

Through the above process, a highly reliable light-emitting display device (display panel) as a semiconductor device can be manufactured.

This embodiment can be combined with any of the other embodiments in this specification as appropriate.

Example 1

In this example, a stacked layer of a silicon oxide film and an organic film was provided over a substrate, the organic film was coated with deuterated water, and then a conductive film was formed in contact with the organic film. Next, an inert conductive material that reacts with deuterated water to a degree that does not easily allows generation of a deuterium ion or a deuterium molecule was selected by measuring the amount of deuterium that existed in the silicon oxide film. In particular, the inert conductive material was selected by evaluating manufactured two kinds of samples in this example: a sample using silver (Ag) for a conductive film and a sample using aluminum (Al) for a conductive film.

Further, a semiconductor device was manufactured in the following manner: in the semiconductor device including a first electrode electrically connected to a source electrode layer or a drain electrode layer of an enhancement transistor including an oxide semiconductor in a channel formation region, and an organic layer containing a light-emitting substance provided between the first electrode and a second electrode overlapped with the first electrode, a conductive film including the conductive material selected in the above method was applied to the second electrode.

The detail of a method for designing the above semiconductor device will be described below with reference to FIGS. 8A to 8D and FIG. 9. Note that in this example, two substrates over each of which a semiconductor element for selecting the material for the second electrode had been formed in advance were prepared. The two substrates were subjected to form a first step to a sixth step except a fourth step in a similar manner. With one of the substrates, a light-emitting display device was manufactured in which the conductive film which was applied to the second electrode was used in a seventh step. On the other hand, with the other substrate, a comparative display device was manufactured for comparison in which a conductive film which was not applied to the second electrode was used.

<First Step: Formation of Silicon Oxide Film>

A silicon oxide film 716 was formed over a substrate 705 over which a transistor 710 including an In—Ga—Zn—O-based oxide semiconductor in a channel formation region was formed. In this example, the silicon oxide film 716 having a thickness of 300 nm was formed by a sputtering method. Note that the transistor 710 was foamed by the method described in Embodiment 2.

<Second Step: Formation of Organic Film>

An organic film 717 was formed over the silicon oxide film 716. In this example, an acrylic organic film 717 having a thickness of 1.5 μm was formed.

<Third Step: Coating with Deuterated Water>

The organic film 717 provided over the substrate 705 was coated with 5 mL of deuterated water in the range of 100 mm×100 mm. The substrate 705 was held for 10 minutes after the coating with deuterated water, and then dry air was sprayed on the substrate 705 and the substrate 705 was dried (see FIG. 8A).

<Fourth Step: Formation of Conductive Film>

Next, the substrate 705 was transferred to a vapor deposition apparatus and a conductive film 702 was formed in contact with the organic film 717. If the conductive film 702 is an inert conductive material, specifically a material that reacts with water or the like and generates a hydrogen ion or a hydrogen molecule, the conductive film 702 reacts with deuterated water which is adsorbed on or diffused into the organic film 717, whereby a deuterium ion or a deuterium molecule is to be generated (see FIG. 8B).

In this example, two kinds of samples were manufactured: a sample 1 in which silver (Ag) was formed to a thickness of 100 nm as the conductive film 702 over one of the two substrates 705; and a sample 2 in which aluminum (Al) was formed to a thickness of 200 nm as the conductive film 702 over the other substrate 705. Note that both of the conductive films 702 were formed in vacuum of $5 \times 10^{-5}$ Pa by a resistance heating method.

<Fifth Step: Measurement of Deuterium Atom Concentration>

Figure 8A:
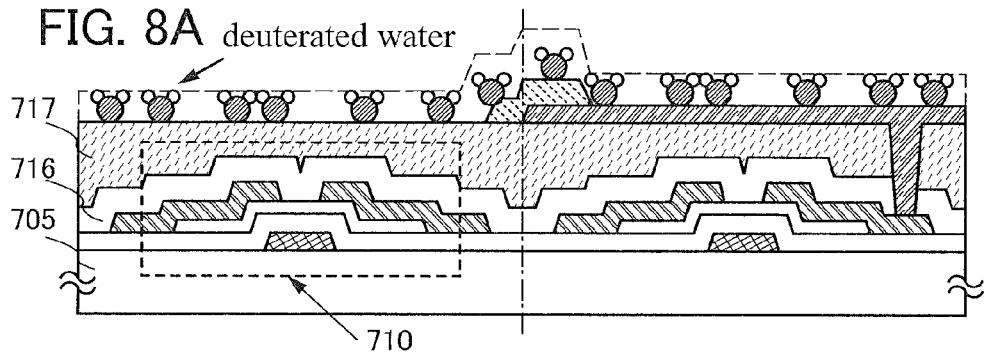
FIGS. 8A to 8D are cross-sectional views illustrating a method for designing a semiconductor device according to an example.
Figure 8B:
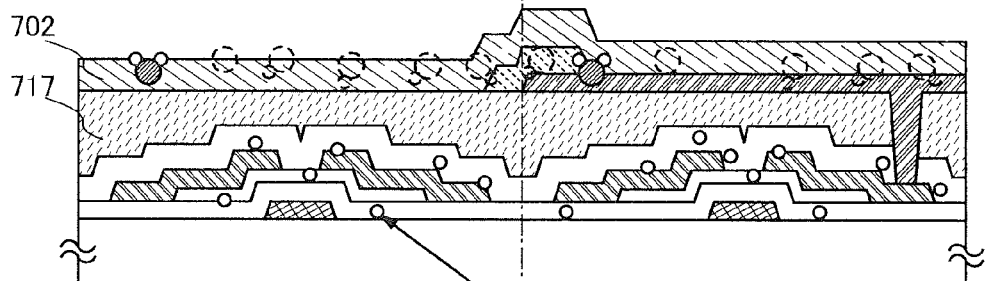
Figure 8C:
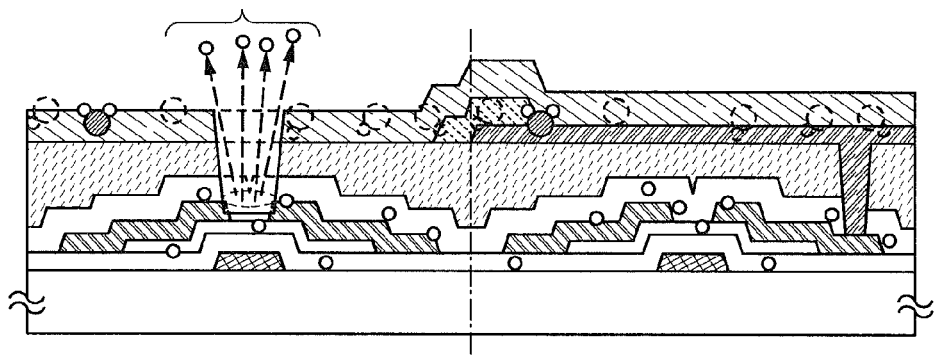
Figure 8D:
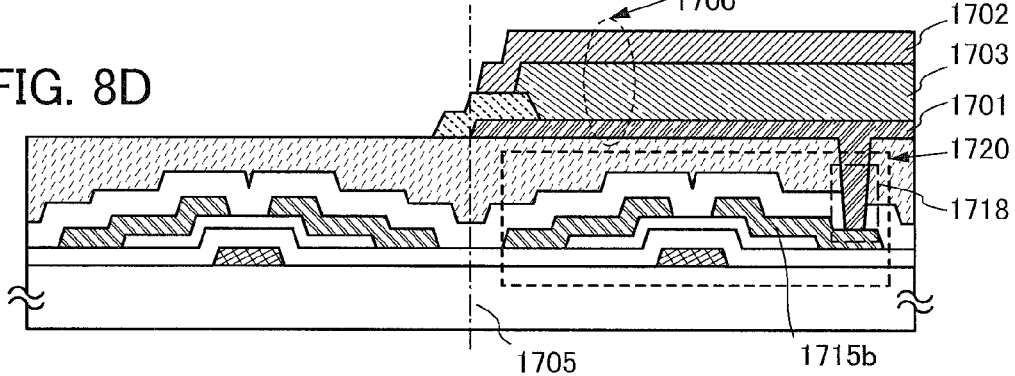

Next, the two substrates 705 (the sample 1 and the sample 2) over each of which the second electrode was formed was taken out from the vapor deposition apparatus and secondary ion mass spectrometry (SIMS) was performed toward the substrate 705 from the conductive film 702 side in each sample (see FIG. 8C). Results of the above SIMS are shown in FIG. 9.

Figure 9:
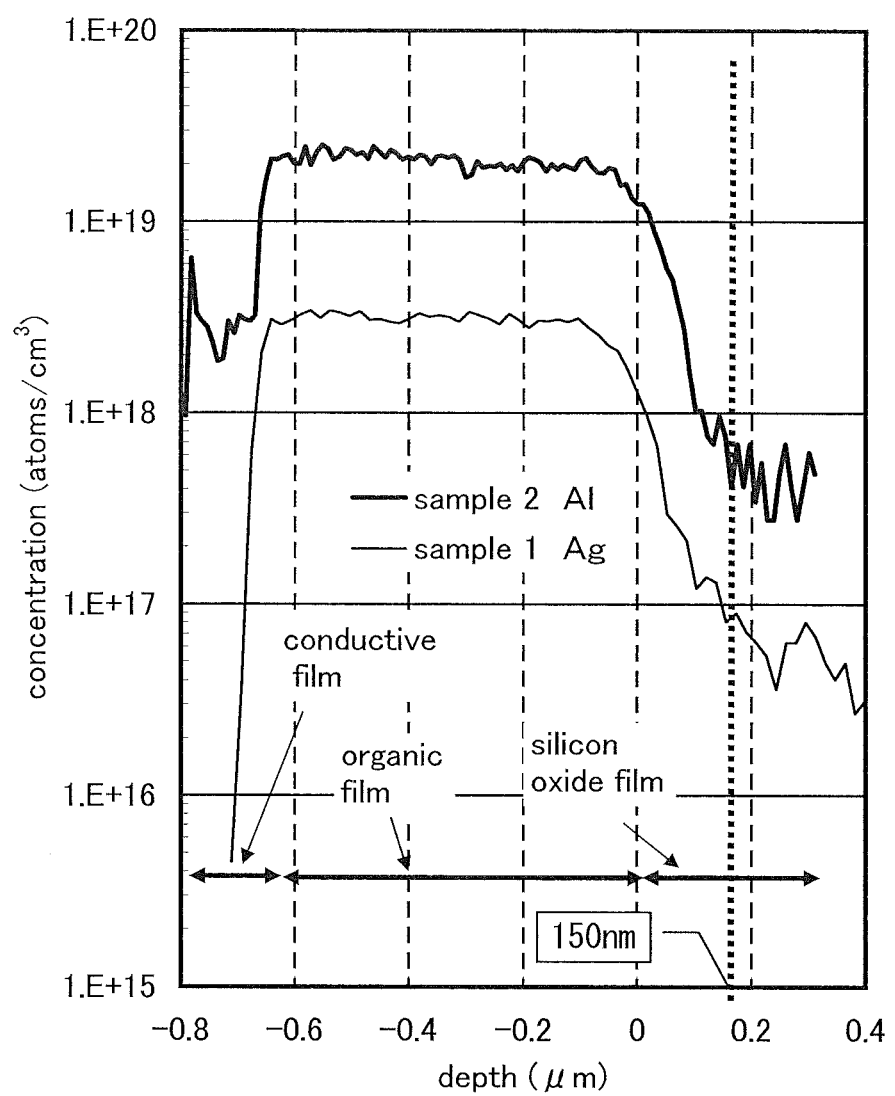
FIG. 9 is a graph showing results of performing secondary ion mass spectrometry on hydrogen concentrations in a silicon oxide film according to an example.

In FIG. 9, the horizontal axis represents a depth and the vertical axis represents the concentrations of hydrogen ions. In the horizontal axis, the depth of an interface between the organic film 717 and the silicon oxide film 716 is set to 0 and the depth of the silicon oxide film side is set to a positive depth. The vertical axis represents the measured hydrogen ion intensities which are converted to hydrogen ion concentrations in the case where the matrix of the silicon oxide films is employed in the vertical axis.

From FIG. 9, in the sample 1 in which silver (Ag) was formed as the conductive film, deuterium atoms of $1 \times 10^{17}$ atoms/cm$^3$ were measured in the silicon oxide film 716. Further, in the sample 2 in which aluminum (Al) was formed as the conductive film, deuterium atoms of $1 \times 10^{18}$ atoms/cm$^3$ were measured in the silicon oxide film 716.

<Sixth Step: Formation of Conductive Film>

As a result of the above SIMS, in the sample 1, the concentration of the deuterium atoms contained at the center of the silicon oxide film 716 in the thickness direction, that is, a portion located 150 nm deep from the interface was higher than or equal to $1 \times 10^{15}$ atoms/cm$^3$ and lower than or equal to $1 \times 10^{17}$ atoms/cm$^3$. Therefore, it was possible to judge that the silver (Ag) used for the sample 1 was an inert conductive material that did not easily react with the deuterated water which was adsorbed on or diffused into the organic film 717. Thus, in this example, a silver thin film was selected as the second electrode of the light-emitting display device. Note that aluminum (Al) was selected as the second electrode of the comparative display device.

<Seventh Step: Application of Selected Conductive Film to Second Electrode>

A substrate 1705 includes a transistor 1720 including an In—Ga—Zn—O-based oxide semiconductor in a channel formation region and a first electrode 1701 connected to a source electrode layer or a drain electrode layer of the transistor 1720 through an opening 1718. In this example, the first electrode 1701 was formed using indium tin oxide containing silicon oxide, whereby a light-emitting element having a bottom emission structure was obtained.

Figure 10:
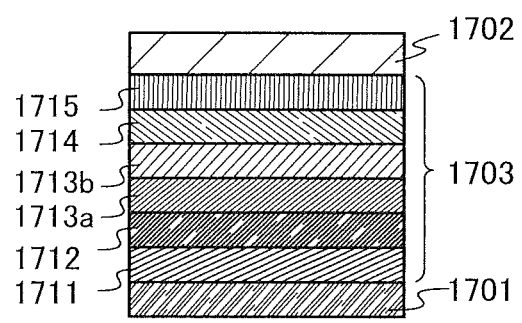
FIG. 10 is a diagram illustrating a structure of a light-emitting element according to an example.

The structures of the light-emitting elements of the light-emitting display device and comparative display device which are manufactured in this example are illustrated in FIG. 10 and Table 1. Each of the light-emitting elements includes the first electrode 1701 provided over the substrate 1705 and an organic layer 1703 containing a light-emitting substance provided between the first electrode 1701 and a second electrode 1702. Note that the silver electrode which was selected in the sixth step was used for the second electrode 1702, and the organic layer 1703 containing a light-emitting substance has a structure in which a hole-injection layer 1711, a hole-transport layer 1712, a first light-emitting layer 1713a, a second light-emitting layer 1713b, an electron-transport layer 1714, and an electron-injection layer 1715 are sequentially stacked.

TABLE 1

|  | first electrode | hole-injection layer | hole-transport layer | first light-emitting layer | second light-emitting layer |
|---|---|---|---|---|---|
| light-emitting display device | ITSO 110 nm | NPB:MoOx (=2:0.222) 200 nm | NPB 10 nm | PCCPA:Rubrene (=1:0.01) 20 nm | CzPA:PCBAPA (=1:0.1) 30 nm |
| comparative display device | ITSO 110 nm | NPB:MoOx (=2:0.222) 200 nm | NPB 10 nm | PCCPA:Rubrene (=1:0.01) 20 nm | CzPA:PCBAPA (=1:0.1) 30 nm |

|  | electron-transport layer | first electron-injection layer | second electron-injection layer | second electrode |
|---|---|---|---|---|
| light-emitting display device | Alq$_3$ 30 nm | LiF 1 nm | Ag:Mg (=0.5:0.05) 5 nm | Ag 100 nm |
| comparative display device | Alq$_3$ 30 nm | LiF 1 nm | — | Al 200 nm |

Note that as a material of each of the light-emitting elements, any of the following was used: indium tin oxide containing silicon oxide (abbreviation: ITSO); 4,4'-bis[N-(1-naphthyl)-N-phenylamino]biphenyl (abbreviation: NPB); molybdenumoxide; 9-phenyl-9'-[4-(10-phenyl-9-anthryl)phenyl]-3,3'-bi(9H-carbazole) (abbreviation: PCCPA); 9-[4-(N-carbazolyl)]phenyl-10-phenylanthracene (abbreviation: CzPA); 4-(10-phenyl-9-anthryl)-4'-(9-phenyl-9H-carbazol-3-yl)triphenylamine (abbreviation: PCBAPA); and tris(8-quinolinolato)aluminum (abbreviation: Alq$_3$).

Sealing was performed in a glove box under a nitrogen atmosphere so that the light-emitting display device and comparative display device which were obtained through the above-described steps were not exposed to the air.

(Evaluation Result)

Figure 11A:
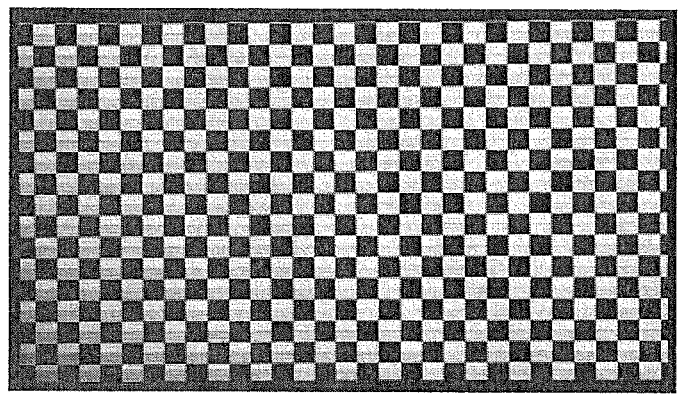
FIGS. 11A and 11B are diagrams illustrating display states of a semiconductor device according to an example.
Figure 11B:
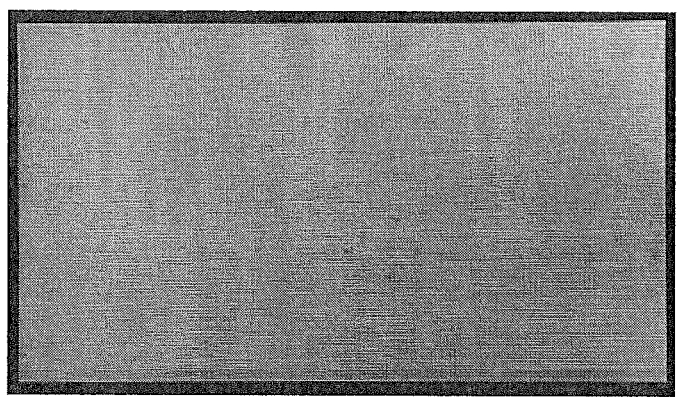

The light-emitting display device in which silver (Ag) was used for the second electrode and the comparative display device in which aluminum (Al) was used for the second electrode were preserved under the environment at 80° C. for 20 minutes. After the preservation for 20 minutes, a signal for performing display of a checker board (also referred to as checker) pattern in each display device was input. Results of the displays are illustrated in FIGS. 11A and 11B. The light-emitting display device in which silver (Ag) was used for the second electrode operated normally (see FIG. 11A). However, the comparative display device in which aluminum (Al) was used for the second electrode did not operate normally (see FIG. 11B).

This application is based on Japanese Patent Application serial No. 2010-191420 filed with the Japan Patent Office on Aug. 27, 2010, the entire contents of which are hereby incorporated by reference.

What is claimed is:

1. A method for designing a semiconductor device comprising the steps of:
    forming a barrier film over a substrate;
    after forming the barrier film, forming a silicon oxide film over the barrier film;
    forming an organic film so as to cover the silicon oxide film;
    coating the organic film with deuterated water;
    partly removing the deuterated water before a conductive film is formed;
    forming the conductive film in contact with the organic film;
    measuring a concentration of deuterium atoms in the silicon oxide film;
    selecting a conductive material so that the concentration of the deuterium atoms in the silicon oxide film is higher than or equal to $1\times10^{15}$ atoms/cm$^3$ and lower than or equal to $1\times10^{17}$ atoms/cm$^3$; and
    applying the conductive material to a second electrode of a light-emitting element comprising a first electrode and the second electrode, the first electrode and the second electrode overlapping with each other,
    wherein the first electrode is electrically connected to a source or a drain electrode of a transistor including an oxide semiconductor layer in a channel formation region.

2. The method for designing a semiconductor device according to claim 1, wherein the concentration of deuterium atoms in the silicon oxide film is measured by secondary ion mass spectrometry.

3. The method for designing a semiconductor device according to claim 1, wherein the deuterated water is coated by a spin coating, a dip coating, a spray method, a droplet discharging method, or a printing method.

4. The method for designing a semiconductor device according to claim 1, wherein the deuterated water is removed by a method that dry air is sprayed.

5. A method for designing a semiconductor device comprising the steps of:
    forming a barrier film over a substrate;
    after forming the barrier film, forming a silicon oxide film over the barrier film;
    forming an organic film so as to cover the silicon oxide film;

removing moisture on the substrate;

coating the organic film with deuterated water;

partly removing the deuterated water before a conductive film is formed;

forming the conductive film in contact with the organic film;

measuring a concentration of deuterium atoms in the silicon oxide film;

selecting a conductive material so that the concentration of the deuterium atoms in the silicon oxide film is higher than or equal to $1\times10^{15}$ atoms/cm$^3$ and lower than or equal to $1\times10^{17}$ atoms/cm$^3$; and applying the conductive material to a second electrode of a light-emitting element comprising a first electrode and the second electrode, the first electrode and the second electrode overlapping with each other, wherein the first electrode is electrically connected to a source or a drain electrode of a transistor including an oxide semiconductor layer in a channel formation region.

6. The method for designing a semiconductor device according to claim 5, wherein the concentration of deuterium atoms in the silicon oxide film is measured by secondary ion mass spectrometry.

7. The method for designing a semiconductor device according to claim 5, wherein the deuterated water is coated by a spin coating, a dip coating, a spray method, a droplet discharging method, or a printing method.

8. The method for designing a semiconductor device according to claim 5, wherein the deuterated water is removed by a method that dry air is sprayed.

9. A method for designing a semiconductor device comprising the steps of:

forming a transistor including an oxide semiconductor layer in a channel formation region over a substrate;

forming an oxide insulating layer so as to cover the transistor;

forming a first electrode electrically connected to a source electrode layer or a drain electrode layer of the transistor;

coating the first electrode with deuterated water;

partly removing the deuterated water before a conductive film is formed;

forming the conductive film in contact with the first electrode;

measuring a concentration of deuterium atoms in the oxide semiconductor layer;

selecting a conductive material so that the concentration of the deuterium atoms in the oxide semiconductor layer is higher than or equal to $5\times10^{15}$ atoms/cm$^3$ and lower than or equal to $5\times10^{17}$ atoms/cm$^3$; and applying the conductive material to a second electrode of a light-emitting element comprising the first electrode and the second electrode, the first electrode and the second electrode overlapping with each other.

10. The method for designing a semiconductor device according to claim 9, wherein the concentration of deuterium atoms in the oxide semiconductor layer is measured by secondary ion mass spectrometry.

11. The method for designing a semiconductor device according to claim 9, further comprising a step of forming a planarization insulating layer over the oxide insulating layer.

12. The method for designing a semiconductor device according to claim 9, wherein the deuterated water is coated by a spin coating, a dip coating, a spray method, a droplet discharging method, or a printing method.

13. The method for designing a semiconductor device according to claim 9, wherein the deuterated water is removed by a method that dry air is sprayed.

14. A method for designing a semiconductor device comprising the steps of:

forming a transistor including an oxide semiconductor layer in a channel formation region over a substrate;

forming an oxide insulating layer so as to cover the transistor;

forming a protective insulating layer over the oxide insulating layer;

forming a first electrode electrically connected to a source electrode layer or a drain electrode layer of the transistor;

coating the first electrode with deuterated water;

partly removing the deuterated water before a conductive film is formed;

forming the conductive film in contact with the first electrode;

measuring a concentration of deuterium atoms in the oxide semiconductor layer;

selecting a conductive material so that the concentration of the deuterium atoms in the oxide semiconductor layer is higher than or equal to $5\times10^{15}$ atoms/cm$^3$ and lower than or equal to $5\times10^{17}$ atoms/cm$^3$; and applying the conductive material to a second electrode of a light-emitting element comprising the first electrode and the second electrode, the first electrode and the second electrode overlapping with each other.

15. The method for designing a semiconductor device according to claim 14, wherein the concentration of deuterium atoms in the oxide semiconductor layer is measured by secondary ion mass spectrometry.

16. The method for designing a semiconductor device according to claim 14, further comprising a step of forming a planarization insulating layer over the protective insulating layer.

17. The method for designing a semiconductor device according to claim 14, wherein the deuterated water is coated by a spin coating, a dip coating, a spray method, a droplet discharging method, or a printing method.

18. The method for designing a semiconductor device according to claim 14, wherein the deuterated water is removed by a method that dry air is sprayed.

* * * * *

UNITED STATES PATENT AND TRADEMARK OFFICE
CERTIFICATE OF CORRECTION

| | | |
|---|---|---|
| PATENT NO. | : 8,592,261 B2 | Page 1 of 1 |
| APPLICATION NO. | : 13/217723 | |
| DATED | : November 26, 2013 | |
| INVENTOR(S) | : Kaoru Hatano and Satoshi Seo | |

It is certified that error appears in the above-identified patent and that said Letters Patent is hereby corrected as shown below:

In the Specification

Column 23, line 16, replace "fanned" with --formed--;

Column 26, line 47, replace "farmed" with --formed--;

Column 34, line 32, replace "tinnier" with --former--;

Column 36, line 47, replace "fainted" with --formed--;

Column 37, line 60, replace "faulted" with --formed--;

Column 41, line 58, replace "foamed" with --formed--;

In the Claims

Column 45, line 53, in claim 9 after "comprising" replace "the" with --a--;

Column 46, line 37, in claim 14 after "comprising" replace "the" with --a--.

Signed and Sealed this
Twenty-fifth Day of November, 2014

Michelle K. Lee
*Deputy Director of the United States Patent and Trademark Office*